United States Patent [19]

Hartsog

[11] Patent Number: 4,964,060

[45] Date of Patent: Oct. 16, 1990

[54] COMPUTER AIDED BUILDING PLAN REVIEW SYSTEM AND PROCESS

[76] Inventor: Charles H. Hartsog, 730 Moreno Ave., Palo Alto, Calif. 94303

[21] Appl. No.: 805,361

[22] Filed: Dec. 4, 1985

[51] Int. Cl.$^5$ ............................................. G06F 15/60
[52] U.S. Cl. .................................................... 364/512
[58] Field of Search ............... 364/512, 513, 468, 505, 364/580; 52/741, 750

[56] References Cited

U.S. PATENT DOCUMENTS

| | | | |
|---|---|---|---|
| 4,275,449 | 1/1981 | Aish | 364/512 |
| 4,370,707 | 1/1983 | Phillips et al. | 364/200 |
| 4,388,610 | 6/1983 | Tsunekawa | 364/491 |
| 4,546,432 | 10/1985 | Umemura et al. | 364/200 |
| 4,551,810 | 11/1985 | Levine | 364/475 |
| 4,586,145 | 4/1986 | Bracewell et al. | 364/512 |
| 4,591,983 | 5/1986 | Bennett et al. | 364/403 |
| 4,599,693 | 7/1986 | Denenberg | 364/513 |
| 4,620,286 | 10/1986 | Smith et al. | 364/513 |
| 4,648,044 | 3/1987 | Hardy et al. | 364/513 |
| 4,651,284 | 3/1987 | Watanabe et al. | 364/491 |
| 4,658,370 | 4/1987 | Erman et al. | 364/513 |
| 4,700,318 | 10/1987 | Ockman | 364/512 |

FOREIGN PATENT DOCUMENTS

| | | | |
|---|---|---|---|
| 88503 | 9/1988 | European Pat. Off. . | |
| 0163665 | 9/1984 | Japan | 364/512 |
| 0708359 | 1/1980 | U.S.S.R. | 364/512 |

OTHER PUBLICATIONS

Dr. J. Weiner, Logic Programming and PROLOG, Jan. 1985, Computers & Electronics (Magazine), pp. 68-71.
Enhancing Knowledge Representation in Engineering Databases, Hartzband et al., Sep. 1985, IEEE Computer.
Artificial Intelligence Research in Japan, Rigas et al., Sep. 1985, IEEE Computer.
The Knowledge-based Expert System: A tutorial, Hayes-Roth, Sep. 1984, IEEE Computer [vol. 17, No. 9], pp. 11-28.
Top-Down Construction of 3-D Mechanical Object Shapes from Engineering Drawings, Yoshiura et al., Dec. 1984, IEEE Computer, vol. 17, No. 2, pp. 32-40.
PROLOG-86 TM User's Guide and Reference Manual, Micro-AI, Rheem Valley, Calif. 94570 [all] ©1983,84 by Micro-AI.
TLC-LISP Documentation; Primer, Metaphysics and Reference Manual ©1984, The LISP Company, POB 487, Redwood Estates, Calif. 95044.
Uniform Building Code and Uniform Building Code Standards, 1985 editions, ©1985 by International Conference of Building Officials, Whittier, Calif. 90601.
Pp. 180-183, Donald A. Waterman, *A Guide to Expert Systems*, ©1982.
bw&a, "Plan Analyst—The Computer Program that Makes Your Code Check Easy", (Advertisement), p. 121; Building Standards/Nov.-Dec. 1987.
bw&a: 3875 Surrey Lane, Colorado Springs, Colo. 80918; "Plan Analyst—The Computer Program that Makes Your Code Check Quicker and Easier", (Product Description) date unknown.

*Primary Examiner*—Parshotam S. Lall
*Assistant Examiner*—S. A. Melnick
*Attorney, Agent, or Firm*—Flehr, Hohbach, Test, Albritton & Herbert

[57] ABSTRACT

A plan checking data processing system (10) has an input (12) for providing a development plan to be checked to the system in a form intelligible to the system (10). Memory (18) contains standards (22) against which the development plan is to be checked, also in a form intelligible to the system (10). A program (20) is used by processor (26) for evaluating the development plan according to the standards (22). An output (30) receives results of the evaluation.

17 Claims, 11 Drawing Sheets

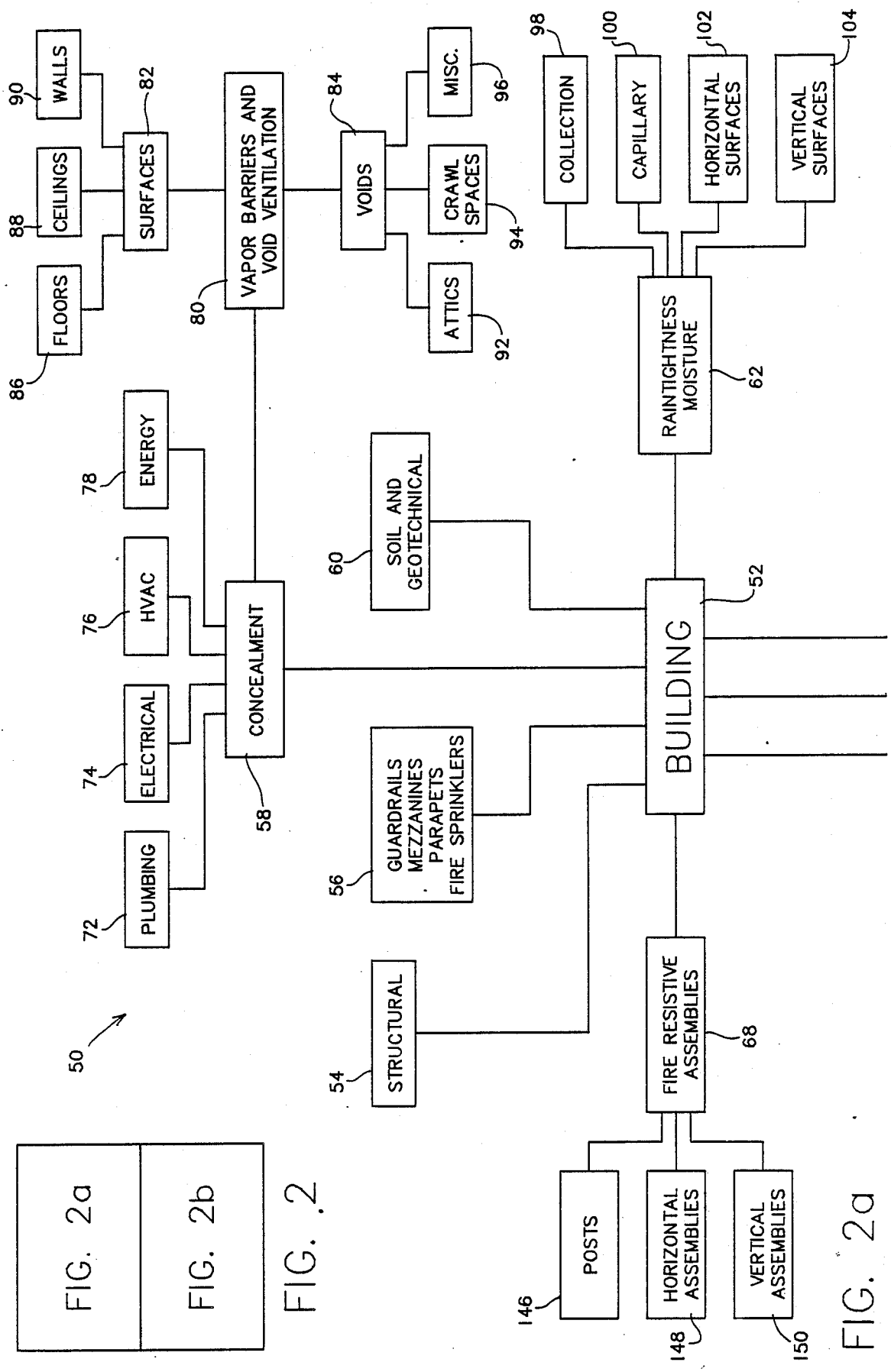

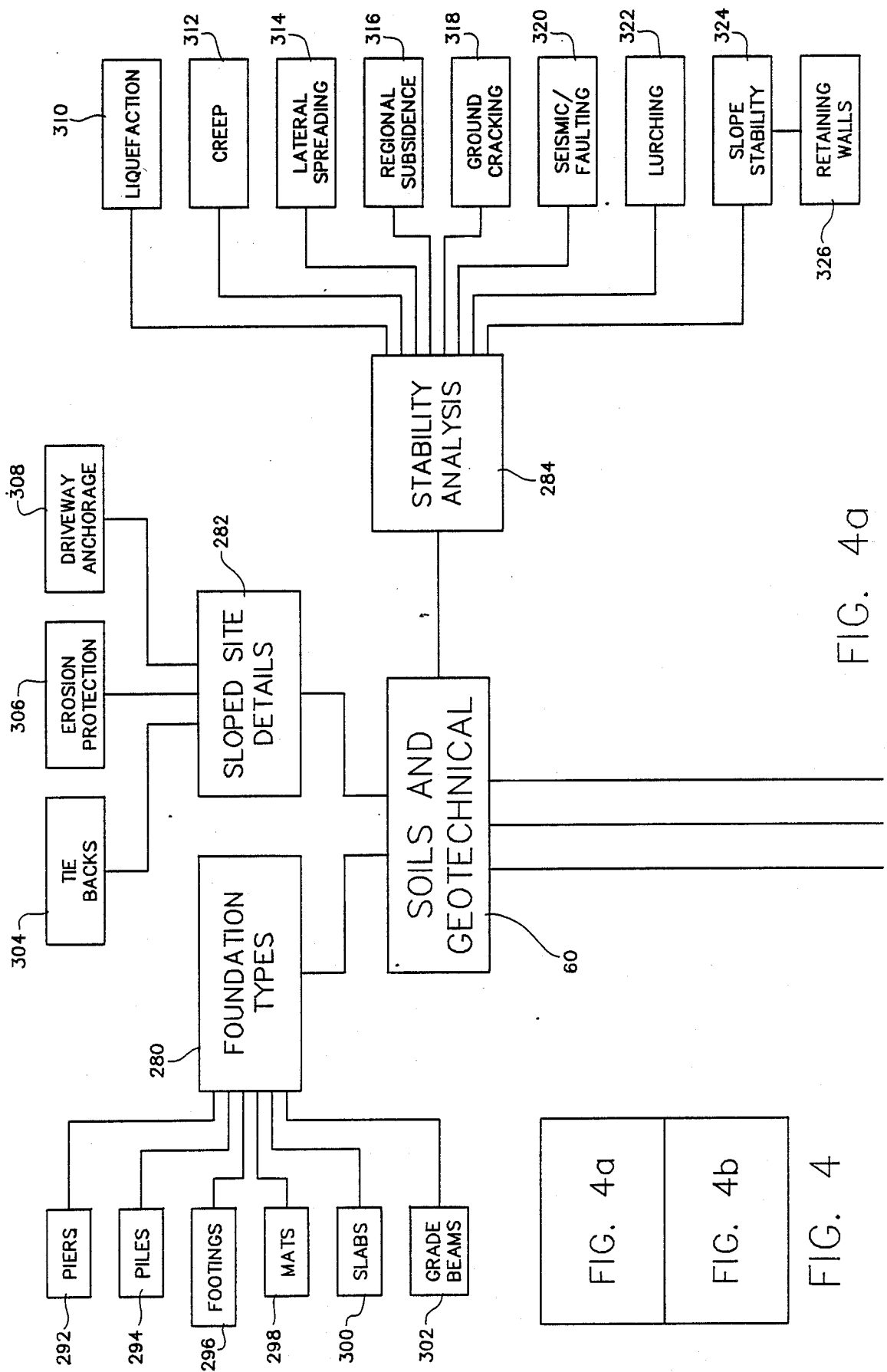

COMPUTER AIDED BUILDING PLAN REVIEW SYSTEM AND PROCESS

BACKGROUND OF THE INVENTION

1. Field of the Invention

This invention relates to a novel computer system and process for checking compliance of development plans with building regulations and codes. More particularly, it relates to such a system and process in which the development plan is provided as an input to a suitably programmed data processing system, which determines whether the development plan is in compliance with such regulations and codes. Most especially, it relates to such a system and process which is also usable for creating the development plan and assisting and directing construction in accordance with the plan after it has been approved.

2. Description of the Prior Art

Plan checking has always been a tedious, lengthy, and time consuming process with frequent errors and omissions. Elimination, or at least a reduction, of these errors and omissions is of obvious benefit to all, and may result in a tremendous reduction of the number of property problems and personal injuries. This would include possible reductions in injuries resulting from code versus non-code stairs. U.S. stair accidents result in approximately 800,000 injuries annually that receive hospital emergency treatment. This may also result in a great simplification at the design and construction stage, with a uniformity of zoning and land development processing. Many stages of the plan checking process require great amounts of time spent answering the same questions time after time. There is always confusion about permit fees currently are of the order of 0.5 percent of typical building costs. Additionally, on the order of 67 percent of the building permit fees are charged for plan checking fees. It is clear that the potential advantages from improving and simplifying the plan checking process are enormous, especially with today's high interest rates for financing. Every day a project is delayed can cost staggering amounts of money.

A variety of systems and processes utilizing data processing systems to simplify other operations commonly performed in a manual manner are also disclosed in prior issued U.S. patents. For example, U.S. Pat. No. 4,370,707, issued Jan. 25, 1983 to Phillips et al. discloses a form of special purpose word processor for drafting achitectural specifications from master phrases indexed by code. In current terminology, the codes for the master phrases could be considered a form of macro used to select the more lengthy master phrases. Macros have been used in word processing applications for many years, including prior to the filing date of the Phillips et al. application. While this patent includes references to various building codes, standards and industry specifications, there is no suggestion of employing the data processing system to determine compliance with such building codes, standards and industry specifications.

U.S. Pat. No. 4,495,559, issued Jan. 22, 1985 to Gelatt, Jr. et al. discloses a design optimization method utilizing a data processing system, in which a scoring approach with iterative exchange of element positions is used to obtain an optimized design. The method is explained with respect to the design of integrated circuits. Similar methods have been in use for many years, such as at California Polytechnic State University, San Luis Obispo, Calif., since at least 1973.

U.S. Pat. No. 4,489,387, issued Dec. 18, 1984 to Lamb et al. discloses a method and apparatus for coordinating medical procedures which ensures that two or more medical teams treating a patient perform diagnostic and therapeutic procedures according to a predetermined plan. U.S. Pat. No. 4,404,639, issued Sept. 13, 1983 to McGuire et al. discloses an automotive diagnostic system including provision for updating vehicle specification records and changes in regulatory requirements applicable to a vehicle.

While there is thus a substantial body of prior art showing various systems and methods for utilizing data processing for simplifying the execution of complex tasks, there is no teaching or suggestion of a data processing system or method for determining compliance of a development plan with local ordinances and regulations.

SUMMARY OF THE INVENTION

Accordingly, it is an object of this invention to provide a data processing system and process which will determine compliance of a development plan with applicable ordinances and regulations.

It is another object of the invention to provide such a plan checking data processing system and process which will provide a user with a list of non-complying items in a development plan if the system and process determines that the plan fails to comply with the applicable ordinances and regulations.

It is a further object of the invention to provide such a plan checking data processing system and process which may further be used in the preparation of the development plan.

It is still another object of the invention to provide a system and process for determining boundaries in a building design.

It is a still further object of the invention to provide such a system and process which incorporates a way to determine if a development plan submitted for checking by the system and process contains conflicting, superfluous and spurious information.

It is yet another object of the invention to provide such a system and process incorporating an improved technique for representing building elements in a machine intelligible format.

It is still another object of the invention to provide such a system and process which may further be used to assist and direct construction after a development plan has been approved.

The attainment of these and related objects may be achieved through use of the novel plan checking data processing system and process herein disclosed. A plan checking data processing system in accordance with the invention has an input means for providing a development plan to be checked to the data processing system in a form intelligible to the data processing system. A storage means contains standards against which the development plan is to be checked. The standards are in a form intelligible to the data processing system. The storage means also contains a control program for evaluating the development plan according to the standards. A processor is connected to receive the development plan after entry to the data processing system through the input means and to receive the standards and control program stored in the storage means. The processor is configured to evaluate the development plan according to the standards using the control program. An output means is connected to receive results of the evaluation.

A process for checking a development plan against predetermined standards in accordance with the invention includes providing the development plan to be checked as an input to a data processing system in a form intelligible to the data processing system. The standards against which the development plan is to be checked are stored in the data processing system in a form intelligible to the data processing system. A control program for evaluating the development plan according to the standards is provided to the data processing system. The development plan is evaluated according to the standards using the control program in the data processing system. Results of the evaluation are provided as an output from the data processing system.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIG. 2 is a key showing placement of FIGS. 2A and 2B.

FIGS. 2A and 2B are a block diagram showing components of a plan check program used to implement the invention.

FIG. 4 is a key showing placement of FIGS. 4A and 4B.

FIGS. 4A and 4B are a more detailed block diagram of another portion of the block diagram shown in FIGS. 2A and 2B.

DETAILED DESCRIPTION OF THE INVENTION

Figure 1:
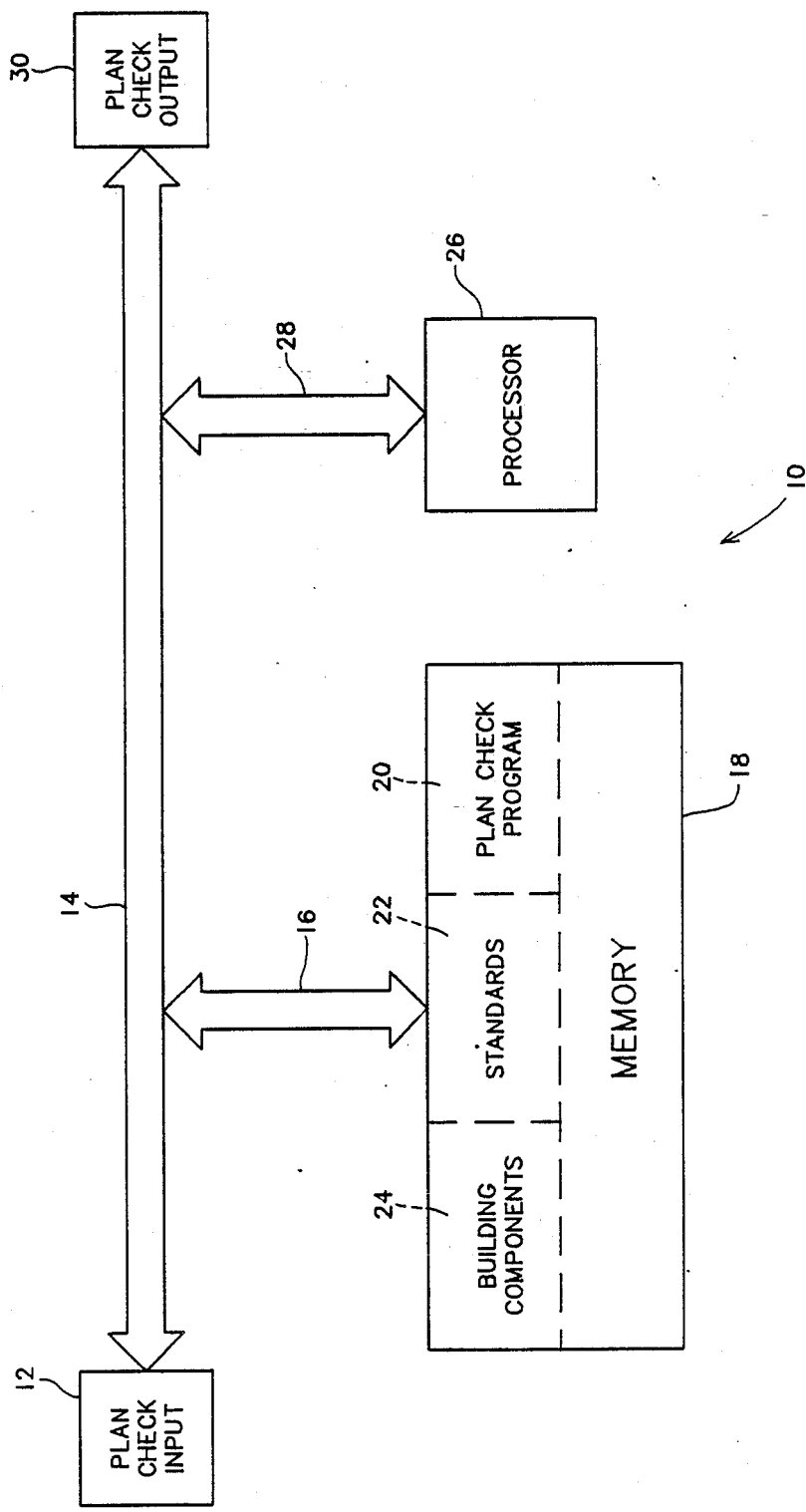
FIG. 1 is a block diagram of a data processing system in accordance with the invention.

Turning now to the drawings, more particularly to FIG. 1, there is shown a data processing system 10 in accordance with the invention. A suitable input device 12, such as a disk or tape drive, is connected to supply the development plan to be checked on busses 14 and 16 to system memory 18. The memory 18 contains a plan check program, standards against which the development plan is to be checked and building component physical characteristics indexed by code, respectively indicated at 20, 22 and 24. A system processor 26 is connected to receive data and instructions from the development plan, standards 22, building component characteristics 24 and plan check program 20 on busses 16, 14 and 28. The processor 26 checks the development plan against the standards 22 using the plan check program 20 and the building component characteristics 24. The results of the plan check are supplied by the processor to memory 18 on busses 28, 14 and 16, and are subsequently supplied on busses 16 and 14 to a suitable output device 30, such as a printer or CRT display.

Before turning to a discussion of the remaining drawings, the following background description of a system and process in accordance with the invention will be presented. The system and programs return a list of code non-complying items (with an explanation facility) as its principal function, displays for the designer major requirements ahead that must be dealt with, and designs working drawings and specifications of sites and structures, with a limited number of steps and decisions made by the designer, using an automated computer process of hardware and software.

Additionally the system (and software) have the following functions:

Powerful window, viewport, and walk-through-/animated viewing of sites and structures;

Evaluating, representing, and reviewing architectural, esthetic, zoning, zoning variances, rezonings, use permits, planned unit developments, general plans and amendments, other designs, and the like;

Automatically generated detailed shop and subdrawings, contracts, subcontracts, work schedules (with consideration for weather, working/calendar days, and the like), suppliers (materials and labor) with availability dates, check off lists for inspections, required materials, and the like;

Displaying to the designer for his selection all possible and reasonable combinations based upon the processed input compared to a specification;

The ability to conceive, predict, and display code requirement obstacles faced ahead on a menu (or otherwise) to the designer during the design process much in the same manner as one must think of the moves ahead in a chess game.

An overall concept of the system is that QUESTIONS are submitted to the system, usually in graphic and equation form. The questions are the input (design data represented and displayed graphically, such as the usual types of drawings prepared for use in the construction industry) that are to be compared to a standard (such as the usual types of BUILDING CODE and PLANNING CODE requirements). ANSWERS are returned by the system (including, but not limited to, a list of code non-compliances) in alpha, numeric, graphic, equation, and symbolic form.

The overall principal methods of the system include, but are not limited to, A SYNTHETIC INTELLIGENCE SYSTEM with chaining utilizing framed and sub-framed combination multi-facet expert/knowledge, rule/object/access based artificial intelligence systems. A knowledge base contains comprehensive design information. Non-framed data input is equivalently structured into components of framed data. Each feature and/or attribute is stored in a slot (non-framed to framed data and/or a sub-framed data system). Structures are equivalently restructured into components of semantic networks, and subsequently processed with an artificial intelligence inference engine utilizing a set of rules to reason about the input data-with respect to the facts in the knowledge base. The rules used by the system to reason generally are the building, planning, and zoning code requirements, as well as proportion rules. Secondary and subsequent processing is performed by an acquisition system. The system output, that may consist of a list of non-complying code items, is also an "explanation facility" that lets the user track the thinking process (without security compromising), as well as to explain how and why a decision was made and allows the user to ask questions about the decision.

The data base management system is processed with an intelligence inference engine system composed of hierarchical, network, and relational methods and organizations. The knowledge representation system consists of combination semantic networks, sub-semantic networks, object/attribute/triplets, rules, frames/sub-frames (with coordinates/sub-coordinates), and logical expressions.

The design portion of the system uses forward chaining as the primary method of reasoning for the system to reason toward a goal. In general, the system seeks to identify all rules whose IF portions are true, and uses THEN portions of the rules to find other rules which are also true. The system has the ability to conceive, predict, select and display code requirement obstacles faced ahead (rules) on a menu (or otherwise) to the designer in a similar manner as one must think of the moves ahead in a chess game. The process of cycling all reasonable options by display provides for optimization as referred to as CYCLIC OPTIMIZATION. The reasonable option guidelines and/or suggestions are "rules of thumb", referred to as HEURISTIC.

The plan checking portion of the system uses reverse chaining as the primary method of reasoning by which the system reviews a hypothesis formed (such as a design submitted for a plan check) and works in reverse to prove or to disprove the hypothesis (such as a check for code compliance). In general, the system seeks to identify and confirm all the rules whose THEN portions match the IF portions, and uses the IF portions of the rules to identify and confirm other rules whose THEN portions match the IF portions.

A tracer analysis and a comparison of the tracer analysis to a specification is used that analyzes the order of, the number of times called, the nesting of the subroutines, the time in computations, the bytes used, data ratios, the subroutines not used, for the software to understand and know when and how phantom data is being, or has been, input in an attempt to deceive or spoof the system.

An intelligence analysis and a comparison of the intelligence analysis to a specification is used that analyzes such factors as the predicates used, arguments used, rules used, objects used, data used, values used, pointers used, source/termination of the pointers, the predicates not used, arguments not used, rules not used, objects not used, data not used, values not used, pointers not used, the order of, the number of times called, the nesting of the data structures, the path through the tree structures, the time in computations, the bytes used and ratios, for the software to understand and know when and how phantom data is being, or has been, input in an attempt to deceive or spoof the system.

This feature allows the plan check processing to follow the design reasoning process (if desired) and permits a path to be built, through a tree structure, of the routines used. This can eliminate the necessity of huge volumes of intermittent data storing, as the design can be regenerated easily, since the tree structure path and the input requirements are known. It also can provide a guard against data loss from various sources and also provides easy revision of alternate designs.

The system can also operate a sub-access oriented method as a follow up program to deal with minor changes and revisions. These are usually of the form: "Can we do this as an alternate to the required detail?"

GLOSSARY AND PROCESS PROCEDURES

The process uses the following procedures and is described in the following terms, that for the purposes of this patent application, are defined herein as:

ACCESS ORIENTED METHODS. The programming methods where the input data can be evaluated as to its relevancy to the plan check process, and all requirements can be reevaluated and displayed, upon the input of the new data (with optional cycling to display possible options by closed loop cycling, such as for exits, floor plans, roof plans, and the like).

This method can also be used in the shortcut processing mode when plans, details, or an assembly have been previously substantially reviewed and approved (by the system or otherwise); and for using, selecting, and reviewing pre-approved designs and details, both with and without "plugged in" or calculated data, notes, comments, specifications, and the like. See CHAINING (INFERRED, or PRE-APPROVED) this section.

ACTIVE DATA. Data that can be modified or data that varies in the execution of a program.

ALGORITHM. A set procedure that produces a set outcome.

ARTIFICIAL INTELLIGENCE (AI). A discipline of computer science where the inferences and representations are usually made with symbolic expressions instead of numeric values and where knowledge schemes may be framed. It is a sub-form of "SYNTHETIC INTELLIGENCE" outlined herein. The principal difference between artificial and synthetic intelligence systems is absoluteness. Artificial intelligence systems usually deal with probabilities, such as calculation of 80% certainty factors. See also SYNTHETIC INTELLIGENCE definition.

AUTOMATIC PROCESSING. The process of the AI languages, such as PROLOG, that automates the extent and the particulars of the processing so that it is only necessary to tell the system "what to do" (in well defined terms), and not "how to do it." This also includes where the design data can be the "program" itself and where the system builds its own tree structure or builds a path through a tree structure.

BACKTRACKING. The process of backing up to a previous level of inferences, usually for trying and evaluating an alternate path by cycling. Design problems almost always require some degree of backtracking in the process of elimination.

BREADTH FIRST SEARCH. A searching strategy where an entire level of hierarchy is examined before any examining of the next level is performed. See DEPTH FIRST SEARCH.

BLACKBOARD. The common working memory of the data base for the data, usually that used in design, that contains all the properties of the components such as materials, equipment, products, and the like, usually stored in a file (with sub-coordinates) and used in computations with other properties. Each building material, equipment, product, and the like is assigned an identification code based upon its properties.

BREAK PACKAGE OR MID-RUN EXPLANATION. A feature of the programming where the program stops to allow an examiner to review the processing up to that point.

BUILDING REGULATIONS. Regulations that are of particular concern regarding the materials and methods of design and construction, usually non-esthetic, referred to, and known as "THE UNIFORM BUILDING CODE."

CENTROID. A reference point.

CHAINING (FORWARD). The method of reasoning by which the system reasons toward a goal, such as is the case in design. In general, the system seeks to identify all rules whose IF portions are true, and uses THEN portions of the rules to find other rules which are also true.

CHAINING (REVERSE). The method of reasoning by which the system reviews a hypothesis formed (such as a design submitted for a plan check) and works in reverse to prove or to disprove the hypothesis (such as a check for code compliance). In general, the system seeks to identify and confirm all the rules whose THEN portions match the IF portions.

CHAINING (INFERRED, or PRE-APPROVED). The method of reasoning by giving the system previous examples of designs and decisions, both approved and denied. The system then induces its own rules and methods and can structure a tree. See ACCESS ORIENTED METHODS this section.

COMPILED KNOWLEDGE. Knowledge organized into chunks and networks of a machine intelligible format.

DELETIONS FILE LISTING. An automatically compiled list generated by the software of superfluous, unnecessary, conflicting, redundant, and irrelevant data, and the like.

CYCLIC OPTIMIZATION. The process of cycling (including by display) all options for optimization.

DEPTH FIRST SEARCH. A searching strategy where the levels below are examined prior to any examining on the current level. See BREADTH FIRST SEARCH.

DETAIL. A specific data representation method (usually graphic representation) of a plan or a scheme.

EQUATION MODE. Processing: The equation processing mode is the heart of the design and plan checking process. The equation mode represents the parts of a building as equations located at the centroids or reference points of the parts. It enables placement of the centroids of the equations by the software automatically using the necessary data from the data files. All building materials, equipment, products and the like are represented by line segment (1 dimensional), plane segment (2 dimensional), or space segment (3 dimensional) equations. The program uses the general form and the configuration of the equations and the data to specify and check appropriately each system against a preset standard.

EQUATION MODE. Graphics: The equation graphics mode programs view returns of the members being represented by their equations only.

EVALUATION FUNCTION. The programming methods that search a search space.

EXPERIMENTAL DATA-KNOWLEDGE. Data or knowledge that is acquired through testing.

EXPLANATION FACILITY. The part of the system that explains how and why a decision was made.

FOLLOW THROUGH. A movement along a perimeter to the point of origin.

FRAME BASED METHODS. The programming methods that generally make use of inheritance procedures and methods in the attributes of frames and subframes.

FRAMED DATA. A knowledge representation method where particulars or attributes about the knowledge or data can be stored in a "slot". Frames may have default, minimum, maximum or calculated data. Frame and subframe attributes may inherit their relations, structures, values, nets, etc.

FRAMED DETAILS. Details that have slotted data and/or are broken down into classification by order levels. Such details may have default, computed, minimum, and maximum values.

GRAPHICS MODE. The modes that display the equations and/or the pictorial views.

GRANULATION. The complete specification and representation of information in the form of rules, frames, nets, and the like.

HARTSOG IDENTIFICATION CODE. An identification code of numerals and symbols.

HEURISTIC. Rules of thumb. Heuristic methods are usually used in design for pruning, and in checking for a supplemental guard against sham and phantom data.

HORN CLAUSES. Expressions such as NOT A OR NOT B.

INDUCTIVE REASONING. (SEE INFERRED REASONING).

INFERENCE CHAIN. The steps used to reach a conclusion.

INFERENCE ENGINE. The part of the AI and SI system that process knowledge to reach conclusions.

INFERENCE METHOD. The method used by the inference engine to process knowledge for forward or reverse chaining.

INFERENCE NET. All possible inference chains that can be generated.

INFERRED REASONING. (INFERRED DATA MODE or PRE-APPROVED). Shortcut processing mode for plans, details or an assembly previously reviewed or approved (by the system or otherwise), and for using, selecting, and reviewing pre-approved designs and details both with and without "plugged in" or calculated data, notes, comments, specifications, and the like. The system may build its own tree structure. See ACCESS ORIENTED METHODS this section.

INHERITANCE. The process by which data may acquire attributes or specifics from other data.

INSPECTION NUMBER and SYMBOL. An identification code of numerals and symbols.

KNOWLEDGE ASSERTED. Knowledge that is claimed or stated to be valid and/or true.

KNOWLEDGE BASE. (Data Facts). All building materials, equipment, products, etc. are represented by line segment (1 dimensional), plane segment (2 dimensional), or space segment (3 dimensional) equations, referenced and/or located at the centroids or sub-reference points of the parts. The data is framed and has each feature and/or attribute stored in a slot.

KNOWLEDGE BASED SYSTEM. A system where the knowledge base (data facts) are separate from the other portions of the system.

KNOWLEDGE INFERRED. (KNOWLEDGE AFFIRMED OR INFERRED REASONING).

KNOWLEDGE QUESTIONS. (Design Questions). Questions submitted to the system, usually in graphic and equation form. In response, the system usually returns answers in alpha, numeric, and symbolic form.

LOGIC BASED METHODS. The programming methods that generally make use of predicate calculus.

METAKNOWLEDGE. Control knowledge of a expert system of how the system reasons.

METARULE A rule controlling the use of other rules.

MONOTONIC REASONING. The technique of processing usually reliable data where once a fact is determined it cannot be retracted in the cycle of reasoning.

MULTI-ATTRIBUTE, MULTI-FRAME, MULTI-NET. An attribute, frame, net, and the like that can have more than one criterion.

MULTIPLE LINES OF REASONING. The technique of processing simultaneously many approaches toward solving a problem.

NATURAL LANGUAGE. A standard verbal language, such as English, that can be software recognized by word speech recognition and can be software created by voice synthesis.

NON-MONOTONIC REASONING. The technique of processing usually unreliable data where the retraction of data that is found to be erroneous is performed.

OBJECT ORIENTED METHODS. The programming methods that generally make use of inheritance procedures and methods in the structure of, and pointers of, semantic nets.

P, V, M, T. Common symbols used in the engineering profession to represent axial, shear, moment and torsion forces.

PARALLEL PROCESSING. A processing method whereby many programs are processed simultaneously.

PLUGGED IN DATA. Data such as dimensions on details that is/are "plugged in." They may or may not contain minimum, maximum, calculated, and default values.

POINT ENTRAINMENT and ENTRAPMENT. Method by which a point or a cursor movement is contained in 2 dimensions.

PRE-APPROVED DATA. (SEE INDUCTIVE REASONING).

PRE-APPROVED DETAILS. (SEE INDUCTIVE REASONING).

PREDICATE CALCULUS. A logic language that utilizes functions and predicates to describe relations.

PROCEDURE ORIENTED METHODS. The programming methods that generally make use of nested routines in an orderly and prescribed manner.

PRUNING. Narrowing the scope of the searching that usually is performed in a tree structured search.

RECONNAISSANCE. The ability to conceive, predict, and display code requirement obstacles faced ahead on a menu (or otherwise) for the designer much in the same manner as the moves ahead in a chess game.

REDUNDANCY EVALUATION. The process by which multiple or redundant data are evaluated, corrected, or eliminated.

RESOLUTION. The technique of establishing the truth of an assertion by contradiction resolution.

RULE BASED METHODS. The programming methods that generally make use of IF-THEN rules in forward or reverse chaining.

RULE BASED SYSTEM. A system organized as rules.

RULES. Usually legal regulations such as BUILDING CODE requirements, and PLANNING CODE requirements, and the like.

SATISFICE. The process of finding only a solution of usually a design condition in a forward chaining process, regardless of whether or not any other solutions exist. See cyclic optimization.

SEARCH SPACE. The complete set of all possible or reasonable solutions. This includes incrementation and cycling.

SEMANTIC NET. A representation method of knowledge consisting of a set of nodes connected by arcs with pointers.

SLOT. The component of a framed data system that is a provisional "slot" for specifics about the data to be entered. It may contain default values, minimum values, maximum values, pointers, and the like.

SPATIAL ENTRAINMENT and ENTRAPMENT. Method by which a point or a cursor movement is contained in 3 dimensions.

SPECIFICATION CODE/NUMBER. The code/number assigned to a particular specification.

STYLISTIC ARCHITECTURAL DESIGN. The procedures of structuring the design methods for the final outcome of certain selected styles of architectural, building and environmental design, such as Spanish, New Mexico, Contemporary, New England, Midwest, and the like.

SYNTHETIC INTELLIGENCE (SI). An advanced level of a combination multifaceted expert knowledge, artificial intelligence system that involves a processing scheme, inference engine, acquisition system, and a layout where: semantic nets and sub-semantic nets are used for structuring; non-framed data is, or has been, equivalently structured into components of framed and subframed data, where each feature and/or attribute is stored in a slot for each frame, and where each sub feature and/or sub attribute is stored in a sub slot for each sub frame; and where the rules to reason are legal requirements. The principal difference between artificial and synthetic intelligence systems is absoluteness. Synthetic intelligence systems are combination algorithm/artificial intelligence systems that usually conclude in an affirmative or negative manner. In other words, it either meets code requirements, or it does not. An algorithmic program by itself could under some circumstances be considered a very specialized synthetic intelligence system. See ARTIFICIAL INTELLIGENCE and ALGORITHMS definitions this section.

TREE STRUCTURE. A knowledge organization method consisting of nodes that are linked similar to a tree. Tree structures may be static or dynamic.

TRACER. A feature of the programming that displays subroutines, data, and rules used, usually for use in the detection of erroneous, sham or spurious data or the explanation of a reasoning process.

WALK THROUGH VIEWING. A "moving" type of viewing that occurs with a moving station point.

WINDOW. A theoretical frame for a 2 dimensional representation to show a view.

WINDOW POINT. The point at which the viewing is desired in methods and systems that both may or may not "cut" physical objects.

GENERAL SYSTEM

Hartsog design and plan check software and hardware work together for security purposes and have tight security procedures requiring both sets of software and hardware to be used concurrently. Furthermore, it is only the design software with secret codes required, at regular intervals that is rented to licensed architects and engineers on certain qualifying conditions.

Data input/output for the design/plan checking processes, control, and commands can be performed by, including but not limited to, voice activation, word speech recognition, and speech synthesis. Each building component is assigned a framed identification code file that is structured and slotted based upon its properties. All properties (including special features) of the material, equipment, product, or the like are stored as attributes in the framed system (with sub-coordinates) and are used in computations with other properties for totals of assemblies. All features may be transferred by order (such as with a menu, mouse, light pen, tablet, digitizer, joystick, touch tablet, touch screen, pedals, trackball, optical/omni scanner, movement detector, or the like) into their position automatically by rough or close positioning if desired. Thus it is possible to describe virtually any building system in a simple manner.

Each data frame also contains in its slots the required inspection codes and specifications codes for construction. The codes and symbols are returned by the CAD (computer aided design) software automatically upon design completion. The returns by the software have universal meanings in place of specifications. The software may also return material lists with the inspection requirements including a checkoff list. The codes and symbols may be looked up in a regularly updated and published looseleaf book or other type catalog, including electronic catalogs and electronic bulletin boards for reference, if needed. This totally eliminates the need for specifications and results in a universal standardization. The codes and symbols can be placed and/or displayed on the drawings and details for clarity if desired. This is exactly opposite to the use of codes to call up standard language for incorporation into a written specification, as taught in the Phillips, et al. patent.

Architectural, esthetic, and other designs are evaluated by a point scoring system of volumes, systems materials, surfaces, lines, points, ratios, angles, colors, textures, styles, rhythms, and the like for compliance with regulations (including, but not limited to) zoning variances, rezonings, use permits, planned unit developments, general plans and amendments, or the like.

The input data can be evaluated as to its relevancy to the plan check process, and subsequent requirements can be reevaluated and displayed, with optional cycling to display possible options by closed loop cycling such as exits, floor plans, roof plans, or the like. See ACCESS ORIENTED METHODS. Notes can be carried, transferred, or displayed automatically where and when requested with redundancy elimination. Design and/or display software can automatically display and/or dimension drawings where requested (from the equations and subroutines). The software contains a "help" subprogram that can answer questions so as not to bother the designer or the inspection agency with trivial questions. Checking can also be by rough comparison of the data to prescribed reasonable proportions and criteria, including audits. The exact and precise routines of the plan check process can be regularly modified and maintained in secrecy, to help avoid circumvention.

The software uses the following methods of understanding and knowing when phantom data is being or has been input in an attempt to deceive or spoof the system for a non-legitimate approval, including, but not limited to, image comparison and analysis performed by multiple systems and by inputs/outputs processing, such as noise blanketing, noise limiting, frequency-amplitude-phase modulation, randomly generated input/output methods. Comparison of parallel processing of all parts of the review process can be performed. Elimination of possible sham, phantom data, and spikes (including but not limited to high frequency), can be performed by utilizing clean power, and clean data inputs/outputs performed in one method by phase isolation, dedicated circuits, circuit shielding, elimination of multiple grounding loops and paths, multiple diode bridges and rectifiers, heavy inductive/capacitance filters, and noise cancellation by phase addition, and the like.

GENERAL PROCESSING MODES

There are two modes that process (including by parallel processing): equation and inferred data (pre-approved).

THE EQUATION MODE. The equation mode is the heart of the design and plan checking process. The equation mode represents the components of a building as equations located at the centroids or reference points of the components. It enables placement of the centroids by the software of the equations automatically with the necessary data from the framed data files. All building components (materials, equipment, products, etc.) are represented by line segment (1 dimensional), plane segment (2 dimensional), or space segment (3 dimensional) equations with rectangular and polar coordinate systems. Structures are equivalently restructured into components of semantic networks. The program uses the general form and the configuration of the equations and the data to specify and check appropriately each system against a preset standard. Forward and reverse chaining methods are used as the primary methods of reasoning for both review and design.

INFERRED CHAINING DATA MODE (PRE-APPROVED). This mode is a shortcut processing method for plans, details, or an assembly, that has been previously approved (by the computer or otherwise), and for using, designing, selecting, and reviewing pre-approved designs and details, both with and without "plugged in" or calculated data, notes, comments, specifications, or the like. Data may be assigned a file number and later be used as pre-approved where only minor changes are processed. The use of pre-approved plans and details (with and without plugged in data) can undoubtedly reduce the plan review time since this will save the computer much processing time that otherwise would be required to approve the plans and details.

THE GRAPHICS PROGRAM

The graphics program has two modes: equation and pictorial. In the equation mode, the program returns a view of the members being represented by their equations only. All that is shown in this mode are points, line segments, plane segments, and space objects. In the display mode, the program returns a view of the true detail and/or picture. The program may display in standard views, oblique, isometric, 1 point perspective, 2 point perspective, and 3 point perspective. The program may call the sub-coordinates, multiple-coordinates, and all data, such as line segments between points of a component, from the data files with an identification code, process the coordinates and reconnect line segment data for the view desired, in the equation and/or graphics mode.

DATA PROCESSING TECHNOLOGY FOR RETURNS

The primary languages for the software include, but are not limited to, LISP, PROLOG, BASIC, and PASCAL. Depending on conditions the languages may or may not be compiled from scrambled SOURCE CODES to MACHINE LANGUAGES. Use is made of numerical methods, such as EVAL, GAUS, FOURIER TRANSFORMS, VECTOR ANALYSIS, STRUCTURAL ANALYSIS, and the like.

The declarative and procedural styles used in the synthetic intelligence-language system outlined herein enable the system to eliminate the usual necessity of being told how to perform its task. It is only necessary to provide a proper description of the criteria that must be satisfied. The language/software system automatically selects the order and the extent of the design processing and checking (including by design data methods where the data is the "program" itself, by randomness and by combination methods for security and other purposes). This is one of the powerful features of the artificial intelligence languages alone. Each program and/or subprogram uses common, as well as its own, subroutines. Subroutines can be nested and can call themselves. The system has the following major programs:

---
ARCHITECTURAL and SITE APPROVAL
GENERAL PLAN, ZONING, REZONING,
SETBACKS, HEIGHTS, PROJECTIONS, COVERAGES
PARKING, ACCESS, and RIGHT OF WAYS
UTILITIES
TYPES OF OCCUPANCY REQUIREMENTS
TYPES OF CONSTRUCTION REQUIREMENTS
AREA-VOLUME-HEIGHTS
WET-DAMP-DRY, LOCATION-BOUNDARIES
PARAPETS
MEZZANINES
GUARDRAILS
SPRINKLERS
EXIT REQUIREMENTS
OCCUPANT LOADS
DOORS
HANDRAILS
STAIRS
HANDICAP
RAINTIGHTNESS
COLLECTION
CAPILLARY
HORIZONTAL SURFACES
VERTICAL SURFACES
CONCEALATION
HVAC & R
ENERGY
ELECTRICAL
PLUMBING
VAPOR BARRIERS and CONCEALED SPACES
VENTILATION
FIRE RESISTANCE
STRUCTURAL MEMBERS and PROTECTION
HORIZONTAL ASSEMBLIES (WALLS and PARTITIONS)
VERTICAL ASSEMBLIES (CEILINGS and FLOORS)
STRUCTURAL
LOADS
ANALYSIS -continued
FRAMING
SYSTEMS
MEMBERS-SUB-SYSTEMS
CONNECTION
MATERIALS
WOOD FRAME
CONCRETE/REINFORCING
STEEL
MASONRY
DISPLAY and GRAPHICS
SPECIFICATIONS
INSPECTIONS
VALUATION and COST ESTIMATION
LANDSCAPING
SOILS and GEOTECHNICAL
WET-DAMP-DRY LOCATIONS-BOUNDARIES
(INDOOR-OUTDOOR)
---

Program locates and classifies all locations, volumes, and surfaces as indoor/outdoor and in the form wet, damp, or dry. There are several methods used by the software to analyze and process the data for execution. They are:
FILL METHOD (a primary method)
REVERSE FILL METHOD (a primary method)
VECTOR ROTATION METHOD
CONVERSE VECTOR PLANE METHOD
DATA INPUT METHOD
PROJECTIONS METHOD In the REVERSE FILL METHOD, outer limits and spatial increments are designated automatically by the software such that every increment is filled and/or enclosed in a layered system from one increment to the next increment in a usually X, Y, Z coordinate system commencing from the outer limits. All volumes or surfaces within the "reverse filling" are assigned as a wet location or surface. This is much in the same manner as filling a container with a liquid to determine its volume and shape. All restrictions or limitations on the "reverse filling" are also assigned as a wet location or surface. All volumes or surfaces within the "reverse filling" that are accessible only by a rise in the Z coordinate system (both with and without any translation of the X and Y coordinates) are assigned as a damp location or surface, until the rise in elevation becomes such that they can be classified as dry. Conversely, locations and surfaces that are accessible only with a drop in the Z coordinate system (without any translation of the X and Y coordinates) are assigned as wet locations or surfaces, possible water pockets (drainage downslopes can be compared). "Reverse filling" is variable sensitive to the different types of boundaries that the method is to determine, such as fire, exits, insulation, or the like.

In the FILL METHOD, outer limits and spatial increments are determined automatically by the software in the method, such that every increment is filled and/or advanced in a layered system from one increment to the next increment in a usually X, Y, Z coordinate system commencing from a general or searched point of origin. All volumes or surfaces within the "filling" are assigned a proper classification for the location or surface. All restrictions or limitations on the "filling" are also specified a proper classification for the location or surface. "Filling" is variable sensitive to the different types of boundaries that the method is to determine, such as fire, exits, insulating, or the like.

In the V(CTOR ROTATION METHOD, parallel vectors are shot inward towards the locations or surfaces, and the angles of the inclination of the vectors can be rotated completely through increments. This is in much the same manner as inclined rain fall hitting exposed surfaces. Intersections of surfaces are appropriately classified.

In the CONVERSE VECTOR PLANE METHOD, revolved vectors are shot outward from all locations (including enclosed or entrapped space, and including those locations found by search) through each plane, and the appropriate faces of the surfaces are assigned accordingly.

In the DATA INPUT METHOD, the locations and surfaces are classified by the software through search and recognition from the data file by the input itself. For example, an interior bathroom labeled on the floor plan, "BATHROOM", might not be classified by the above mentioned methods, but could be so classified by this method and/or program, which would search and so classify all such locations.

In the PROJECTIONS METHOD, comparisons are made of the "projections" irom the locations and boundaries specified from the methods for values and locations. Comparisons are made, including those of the "projections" for true classifications. The most restrictive classifications govern. The software determines the combination of methods by itself. Escapes may be set up on the loops so that once a surface or location has been classified as wet, time can be saved by proceeding to the next surface or location.

AREA-VOLUME-HEIGHTS

This program returns and chains the areas, volumes, and heights (both number of stories and dimensional elevations in numerical values such as "feet") from the assigned locations and boundaries where they are located or specified. Methods used include, but are not limited to, addition and subtraction of the remainder from the fill boundaries, mensuration, integration, equation fitting, and the like. Comparisons are made of the "projections" from the locations and boundaries specified from the fill method for true values, and as a supplemental guard against phantom data.

GENERAL PLAN, ZONING, REZONING, PARKING, ACCESS, and RIGHT OF WAYS, UTILITIES, ARCHITECTURAL and SITE APPROVAL The specifics of the general plan, zoning, and rezoning software need to be written for each ordinance due to the substantial differences in type, number of ordinances, and the requirements of each community. A point scoring system to reach designated totals is employed (substitutes for subjective nature items) for values such as, colors, textures, areas, volumes, patterns, rhythms, slopes, heights, shapes, vegetation, ratios, offsets, materials, occupancies, uses, noises (types, volumes, frequencies, rhythms, and the like). A typical flow chart may look like that displayed herein.

Utilities, e.g., water, power, gas, and sewer systems are all represented by framed data equation systems in data bases such that they are stored, and accessed by an SI or AI inference engine system.

SUBJECT MATERIAL CHAINED BY SYNTHETIC INTELLIGENCE

Includes, but is not limited to:

SITE CONDITIONS

General plans, zoning, rezoning, and use permits. Parking: number of stalls, size, access, bumper stops Landscaping: irrigation, vegetation, climate zone, Health systems: food, septic systems, and the like. Building Security Systems: locks, bars, lights.

AREA CONDITIONS

Parking, traffic, and public transportation, school, day care center, employment effects, crime, lighting, and reduction, drainage systems, street curbs and gutters, environmental impact report, economic impact report, fee schedules and tax impact reports

STRUCTURAL LOAD APPLICATIONS AND GENERATIONS

The structural program is a basic part of the design and plan checking process. The structural program represents the parts and/or structural members of a building as equations located at the centroids or reference points of the parts. It generates and places the centroids of the equations automatically by receiving the necessary framed data by inheritance, matrix and interaction. All structural materials, equipment, products, and the like are represented by equations such as a line segment equation if 1 dimensional, plane segment equation if 2 dimensional, or a space segment equation if 3 dimensional. Connections of structural members are represented by the intersections of the equations and have loads that are transferred to them in an X, Y, Z coordinate system as $+,-P$, $+-V$, $+-M$, and $+-T$ for axial, shear, moment, and torsion.

Structural members represented by equations have the form of their equations decided as 1 - 2 - 3 dimensional by the physical dimensional load versus span relationship of the connections, if any, and not necessarily (both vertical and horizontal) by the actual 1 - 2 - 3 dimensional characteristics of the member. Equations are "framed" in their structure with inheritance, minimum, maximum, calculated, and default values and forms. Structures are equivalently restructured into components of semantic networks. System equations are used for the total of a series of equations, such as roofs, walls, floors, etc. with proper neglection of stiffness and strength of nonstructural elements, but with loading nodes.

STRUCTURAL SYSTEM and DETAIL RECOGNIZER

Program returns and chains prohibition classifications (if details are being proposed or if overall structural systems are specified) that are not allowed by the code. The program uses the general form and the configuration of the equations and the data to recognize appropriately such details and systems. Equations are represented in the computer bit patterns by their identification codes, matrices and pointers, and form arrays which are compared to a file for such recognition. Summations are also made of all of the properties for totals of systems and assemblies, which are also compared to the file for its recognition Examples: (1) a wood ledger is not allowed to provide lateral support for a concrete wall in cross grain bending or tension. (2) a plywood shear wall is not allowed to provide lateral support for a concrete or masonry block wall over one story in height. These systems could also be found by having "zero" as an allowable stress or load factor for the above in the analysis.

STRUCTURAL LOADS

Program returns and chains the structural loads by reference from the code file slots, and occupancy slots, and the like, and applies the structural loads at: (1) The nodal centroids of the members (dead and seismic loads); (2) The center of projected areas (live and wind loads). Consideration for the generation of the loading is given to minimum code requirements, occupancy, type of construction, heights above/below the points of application, durations, and the like.

STRUCTURAL ANALYSIS

Program returns performed and chains structural analysis for conditions of all possible loading combinations that result in maximum P, V, M, T, and deflections, of each connection and for each structural member. Instability of the structural system can be found by the load paths of resistance (or lack thereof) with all loads carried through from points of generation to points of dissipation, which is performed by the structural analysis program. Moment, matrix, energy, section, and joint methods, and the like are employed, together with a final closure check of all loads. Working stress methods can be compared to ultimate strength methods for both static and dynamic analysis. Dynamic analysis includes: structural and site periods, mode shapes, response spectrums, response histories, required ductilities, story displacements and drifts, overturning moments, and the like. Lateral force resisting systems are investigated for a positive system of anchorages, subdiaphragms, continuous ties between diaphragm chords, chords, and collectors, with all loads carried through from points of generation to points of dissipation, with required ductility factors for the systems, members, and connections chained.

STRESS ANALYSIS

Program returns performed and chains stress analysis on the structural members with maximum loading combinations that result in maximum conditions of axial, shear, flexural, and torsional stresses, of each structural member. Structural members for steel and wood frame are stress, load, and ductility demand chained by file comparison. Structural members for concrete and masonry are stress, load, and ductility demand evaluated at specified increments with a structural stress analysis subroutine that calculates bond, concrete, shear, compression and steel stresses (for working stress) and calculates concrete compression, shear, yielding, and ultimate moments (for ultimate strength).

STRUCTURAL CONNECTIONS AND ELEMENTS

Program chains structural connections for the transferring of loads from one member to another, broken down into P, V, M, and T components in an X, Y, Z coordinate system.

WOOD FRAME (INCLUDING GLUE LAMINATION)

Structural connection methods: face nails, toe nails, end nails, blind nails, bolts, screws, lag bolts, split rings, Simpson connectors (KC, and the like). All connection methods are chained for minimum end and edge distances. Structural connections are load and ductility demand chained by file comparison. Connections are type specified and chained by the software against the data that compose the equations, such as wood stud to wood sill, wood ledger to concrete wall (lateral loading is not permitted), angle of intersection, directions of loading, and the like. Connections are load specified and chained by the structural load that it must sustain, with consideration given to the type of the load, and its duration.

STEEL

Primary structural connection methods and members: welds, bolts, and rivets. Secondary connection methods and members include stiffener, gusset, and base plates. All connection methods are chained for minimum end and edge distances. Primary structural connection methods are load and ductility demand chained by file comparison, are type specified and chained by the software against the data that compose the equations, such as steel beam to column, column to concrete foundation, angle of intersection, directions of loading, and the like. Secondary connection methods and members are represented by subequation methods, with subframed data, and with a subcoordinate system. This is much in the same manner as structural members are represented by equation methods, framed data, and a coordinate system. Stiffener plate chaining can be performed where the data and the dimensions of the members can be obtained from the slots. Connections are load specified and chained by the structural load that they must sustain, with consideration given to the type of the load, and its duration.

MASONRY

Primary structural connection methods and members: anchor bolts, extended reinforcing, and Simpson connectors. The processing is similar to that of concrete as described herein.

CONCRETE

Primary structural connection methods and members: anchor bolts, extended reinforcing, and Simpson connectors. Structural members are stress, load, and ductility demand chained at automatically specified increments through the intersection with a structural stress analysis subroutine that calculates bond, concrete, and steel stresses (for working stress) and calculates concrete, compression, shear, steel yielding, and ultimate moments (for ultimate strength).

Steel reinforcing representation of a concrete structural member can be represented as a sub-coordinate system within the subcoordinates of the concrete structural member. This may be chained as a framed sub-subcoordinate system. Steel reinforcing representation and requirement equations (with sub-coordinates) are a simplified and specialized case of prestressing and/or post-tensioning where the jacking and/or axial forces are zero.

Rectangular and polar coordinates are used in the representation of steel reinforcing. Summations and subtractions are made of basic framed reinforcing equations for their true equations where they are modified.

Structural steel reinforcing equations generally are framed and are of the form in final condition as follows:

---

Shear:

|  |  |
|---|---|
| Closed Ties | 2 Dimensional |
| Open Ties | 2 Dimensional, slotted |
| Longitudinal Ties | 1 Dimensional |
| Flexural: | |
| Tension | 1 Dimensional |
| Compression | 1 Dimensional |
| Prestressing | 2 Dimensional |
| Posttensioning | 2 Dimensional |

Concrete structural member equations generally are framed and are of the form in final condition as follows:
Structural Slabs: 2 Dimensional
Shells and Folded Plates: 3 Dimensional
Structural Beams and Columns: 1 Dimensional
Walls 2 Dimensional
Footings 1 Dimensional
Foundation Mats: 2 Dimensional
Drilled Piers and Piles: 1 Dimensional
In the case of piers and piles, soil would probably be represented by a 3 dimensional equation with subtraction of the equations of the piers and piles.

The system chains for (including, but not limited to):
Thickness ratios
Smooth corners
Details of reinforcing
  Hooks
  Bend diameters
  Clearances
  Spacing, location
  Coverages
  Shrinkage, temperature reinforcing areas
  Lateral reinforcement
  Jamb steel
  Maximum/minimum reinforcement areas
  Distances between expansion joints Program returns and chains incremental stress analysis on the structural concrete members for conditions of loading combinations that result in axial, shear, flexural, and torsional stresses, by loops, of each increment of the structural members. The structural concrete members are chained at specified increments for their maximum allowable shear, axial, flexural, and torsional load capabilities. The structural concrete can also be represented as a sub-structural system where a beam is composed of two different materials (Es/Ec). Equivalent modulus of elasticity and moments of inertia can be computed.

Program returns performed "EQUIVALENT EQUATION STRESS ANALYSIS" on the structural concrete member connections for conditions of loading combinations that result in axial, shear, flexural, and torsional stresses, by loops, of each increment of the structural members.

DETAILS

Exposure considerations, such as location, weather, fire, moisture, and the like are chained in the processes.

PENETRATION FEATURES

Program chains a "penetration feature" whereby structural penetrations are evaluated by structural subroutine calling.

NON-STRUCTURAL MEMBERS AND CONNECTIONS

Non-structural connections are chained by slot and/or file comparison with consideration for location, occupancy, fire, weather, moisture, and the like.

FIRE RESISTANCE PROTECTION AND ASSEMBLIES

Program returns and chains the fire resistive characteristics of the assemblies classified according to the code, such as 1 hour, 2 hour, and the like. It may do this by a summation and chaining method of all of the components of the assembly for assembly rating with appropriate neglections, to code requirements by schedules. Doors and other openings are also chained for appropriate rating and/or protection. Program uses variations of the fill, reverse fill, vector rotation, converse vector plane, data input, and projection methods for boundary determination. Consideration for horizontal versus vertical assemblies is made by slope comparison. Program also returns and chains the locations where mechanical, plumbing, and electrical routing can be made inconspicuously, such as wall interiors and other concealed spaces by the aforementioned boundary determinations and by concealation calling.

RAINTIGHTNESS-DRAINAGE

This program chains the assemblies of all designated surfaces, such as surfaces exposed to the weather, e.g. roofs, exterior walls, and the like for material type, underlayment, slope, capillary action, permeability, drip lips, etc. It may do this by comparing all specified data with its conditions of design to that of the code.

TYPES OF CONSTRUCTION and OCCUPANCIES

This program chains, using variations of the fill and reverse fill method subprograms, to locate, both vertically and horizontally, the fire resistive boundaries of the spaces. The volume area program determines the code required properties of the spaces. The program determines code required separations of the spaces, setbacks, protected/permitted openings, sprinkler increases, and other allowable increases by comparison reference, and compares the properties by reference to code maximums. Setbacks, maximum and minimum dimensions, can be chained by loops, increments automatically selected by the software calculating their dimensions, and by the follow through analysis.

BUILDING EXIT REQUIREMENTS

The primary methods of the following programs consist of variations of the fill and reverse fill methods. Floor area increments are chained and evaluated for location, elevation difference between adjacent increments, slope between adjacent increments, clearances between increments, and the like.

OCCUPANT LOADS

Program returns and chains the occupant load numbers for each room and of the premises. It may do this by manipulation of the floor areas (determined by boundary/fill methods) with the required unit occupant loads.

EXITS

Program returns and chains non-compliance of the exit plans. It may find the exits by variations of the projection/fill/reverse fill methods. Chaining includes, but is not limited to, number, width, arrangement, locations, distances to exits, routing through adjoining rooms, clearances, locking of exits, and the like.

RAMPS

Program returns and chains non-compliance of the ramp plans. It may find the ramps by slope evaluation, and processes by chaining, including, but not limited to, slopes, width, lengths, landings, handrails, construction, surface, terminations, and the like.

CORRIDORS and EXTERIOR EXIT BALCONIES

Program returns and chains non-compliance of the corridor and balcony plans. It may find the corridor and balconies by variations of the projection/fill/reverse fill methods Chaining includes, but is not limited to, number, length, width, arrangement, locations, distances to exits, routing through adjoining rooms, clearances, locking of exits, and the like.

SMOKEPROOF ENCLOSURES

Program returns and chains non-compliance of the smokeproof enclosures plans. It may find the enclosures by variations of the projection/fill/reverse fill methods. Chaining includes, but is not limited to, number, heights, width, arrangement, locations, distances to exits, routing, clearances, locking of exits, and the like.

STAIRS

Stairs can be chained in the design stage by reference and are chained by comparison to a schedule with consideration for height, length, width, rise, run, landings, and the like. Stairs can also be specified in the design stage in the manner of a sub-structural system. Program returns and chains non-compliance of the stair plans, including but not limited to, number of steps, width, rise to run, arrangement, landings, distance between landings, headroom, distance as exits for adjoining rooms, location, and the like.

DOORS

Program returns and chains non-compliance of the door plans, including but not limited to, direction of swing, type, number, width, height, arrangement, distance as exits through adjoining rooms, location, type of locks, panic hardware, floor level at doors, and the like. Fire resistive requirements for the door assemblies are evaluated elsewhere.

HANDRAILS

Handrails can be chained with consideration for occupancy, loads, height, length, width, rise, run, landings, and the like.

GUARDRAILS

Guardrails can be chained by reference to a schedule. All building floor area increments are looped and compared in the X, Y, Z coordinate system by reference to a schedule with consideration for occupancy, loads, heights, elevation differences, length, width, clearance, rise, run, landings, openings in the railing, and the like.

MEZZANINES

Mezzanines may be chained, considered and processed as an intermediate floor placed within a room, using the same conditions, procedures, and methods as described herein.

CONCEALATION

Program returns and chains the interior locations where mechanical, plumbing, and electrical routing can be made inconspicuously, such as wall interiors, ceiling floor assemblies, and other concealed spaces. Program uses variations of the fill, reverse fill, vector rotation, converse vector plane, data input, and projection methods for this determination.

PLUMBING and ELECTRICAL

Program returns and chains non-compliances of the plumbing and electrical plans, including but not limited to, type and number of fixtures required, locations, heights, supplies, drainage, gas, flues, vents, direction, type, number, size, fittings, slopes, anchorages, clearances, fire resistive requirements, occupancy and adjoining rooms, floor-wall-ceiling finishes, and the like. Chaining by the software is performed by calculating minimum requirements, and comparing the data to the code. Program contains "hole features" whereby structural penetrations are evaluated by subroutine calling.

Design program returns options for the designer in the design selection, considering minimum costs, minimum lengths, minimum number of members, minimum number of connections, minimum turns, pressures, slopes, and the like. Evaluation by the software is performed by calling the subroutine hereinabove mentioned and with loops to evaluate all possibilities.

HEATING, VENTILATING, AIR CONDITIONING, and REFRIGERATION.

Program returns and chains (including non-compliance) of the H.V.A.C. plans, including but not limited to, type and number of fixtures required, locations, heights, supplies, drainage, gas, flues, vents, direction, type, size, fittings, slopes, anchorages, clearances, fire resistive requirements, occupancies and adjoining rooms, floor/wall/ceiling finishes, and the like.

Design program returns and chains options for the designer in the design selection, considering minimum costs, minimum lengths, minimum number of members, minimum number of connections, minimum turns, pressures, slopes, and the like. Evaluation by the software is performed by calling the subroutine hereinabove mentioned and with loops to evaluate all possibilities.

Evaluation by the software is performed by calculating minimum requirements, and comparing the data to the code. Program knows the interior locations where mechanical plumbing, and electrical routing can be made inconspicuously (such as wall interiors, ceiling floor assemblies, and other concealed spaces) from the CONCEALATION PROGRAM. Program knows the exterior locations where mechanical systems may exhaust and discharge, using the WET/DAMP/DRY-INTERIOR/EXTERIOR programs subroutine. Program knows the interior locations where H.V.A.C. will be required by the same methods. Program also uses sub-variations of the fill, reverse fill, vector rotation, converse vector plane, data input, and projection methods for these determinations. Program chains "hole features" whereby penetrations are evaluated by subroutine calling.

ENERGY

Program returns lists of and chains (including code non-compliance of) the energy requirements, including but not limited to, insulation, glazing area ratios to floor areas, sealing, and the like. Evaluation by the software is performed by calculating minimum requirements, and comparing the data.

SPECIFICATIONS, INSPECTIONS, and COST ESTIMATION

Program returns the following lists, all automatically generated and detailed: regulations, specifications, manufacturers, materials, costs, bid forms, contracts, subcontracts, work schedules (with consideration for weather forecasting and daily weather history, working/calendar days, holidays, and the like), suppliers (materials and labor) with availability dates, check off lists for required inspections, and the like.

DISPLAY and GRAPHICS

Program returns the views in the desired directions from the locations where windows and viewports are specified. Views such as sections, details, oblique drawings, isometric drawings, 1 point perspectives, 2 point perspectives, 3 point perspectives are possible. Program can also return views of mechanical, plumbing, and electrical routing where they are inconspicuous, such as in wall interiors, ceilings, and the like. Program can also return views of mechanical, plumbing, and electrical routing from inside the system for route checking. This includes movements inside of the systems, such as ducts, piping, and the like; the ability to select courses of movement at intersections, and to follow along the outside of piping.

Program returns (and lists) automatically generated detailed shop and subdrawings for manufactured items, such as: glue lam beams, steel reinforcing, and the like. Automatic development and generation of the shop drawings can be accomplished with a display of all items that are to be manufactured, and screen dumps the view.

The program includes an optional automatic display of all items that are to be manufactured by a manufacturer with zoom and revolution viewing, which instructs the system 10 (FIG. 1) to chain these elements in accordance with the applicable standards of the Uniform Building Code, as stored in memory 18 and retrieved by processor 26 as required.

Figure 2B:
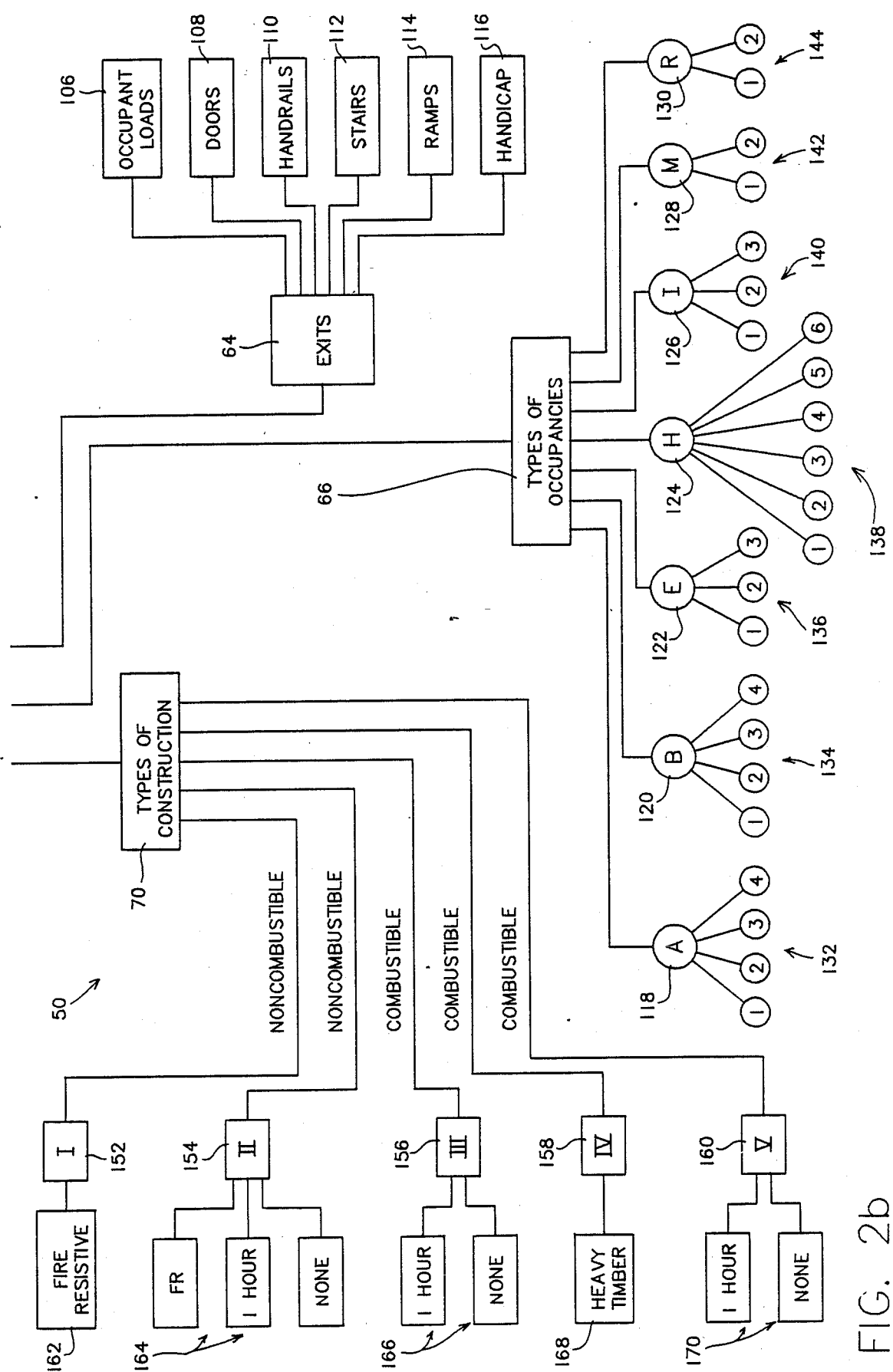

FIGS. 2A and 2B show a branched tree structure 50 for a program in accordance with the invention used to implement plan checking under the 1985 Edition of the Uniform Building Code, which is the model for most local building codes. The branched tree structure 50 starts with the broad category of building, indicated at 52. The program is divided into a number of modules 54, 56, 58, 60, 62, 64, 66, 68 and 70, which are called in succession as the program is run to chain a building plan in practice of the invention. Module 54 is concerned with the structural aspects of the building 52 and will be explained further below in connection with FIG. 3. Module 56 is concerned with fire sprinklers, guardrails, mezzanines and parapets. Module 58 deals with concealed systems in the building 52, and includes subroutines 72, 74, 76, 78 and 80, respectively for plumbing, electrical, HVAC, energy and vapor barriers and concealed space ventilation. The vapor barriers and concealed space ventilation routine 80 includes surface analysis 82 and concealed space analysis 84. The surface analysis routine 82 in turn has subroutines for floors 86, ceilings 88 and walls 90. The concealed space analysis routine 84 has subroutines for attics 92, crawl spaces 94 and miscellaneous 96.

Module 60 chains soil and other geotechnical aspects of the proposed building 52. Module 62 chains rain and moisture handling systems of the proposed building, and has routines for collection 98, capillary 100, horizontal surfaces 102 and vertical surfaces 104. Module 64 chains exits of the proposed building and has routines for occupant loads 106, doors 108, handrails 110, stairs 112, ramps 114 and facilities for the handicapped 116.

Module 66 chains for the requirements for different types of occupancy for the proposed building. It has routines 118, 120, 122, 124, 126, 128 and 130 for the categories of occupation as defined in the Uniform Building Code, which are assembly, business, educational, hazardous, institutional, miscellaneous and residential, respectively. Each of these occupancy type routines 118-130 in turn have routines for subcategories of each occupation category at 132, 134, 136, 138, 140, 142 and 144, as defined by the code.

Module 68 chains for fire resistive assemblies, and has routines for parts 146, horizontal assemblies 148 and vertical assemblies 150. Module 70 chains the two categories of noncombustible construction with routines 152 and 154, as defined for noncombustible construction, and the three categories of combustible construction with routines 156, 158 and 160 The category routines 152-160 are further divided into subroutines 162, 164, 166, 168 and 170 subcategories, as defined for combustible construction.

Figure 3:
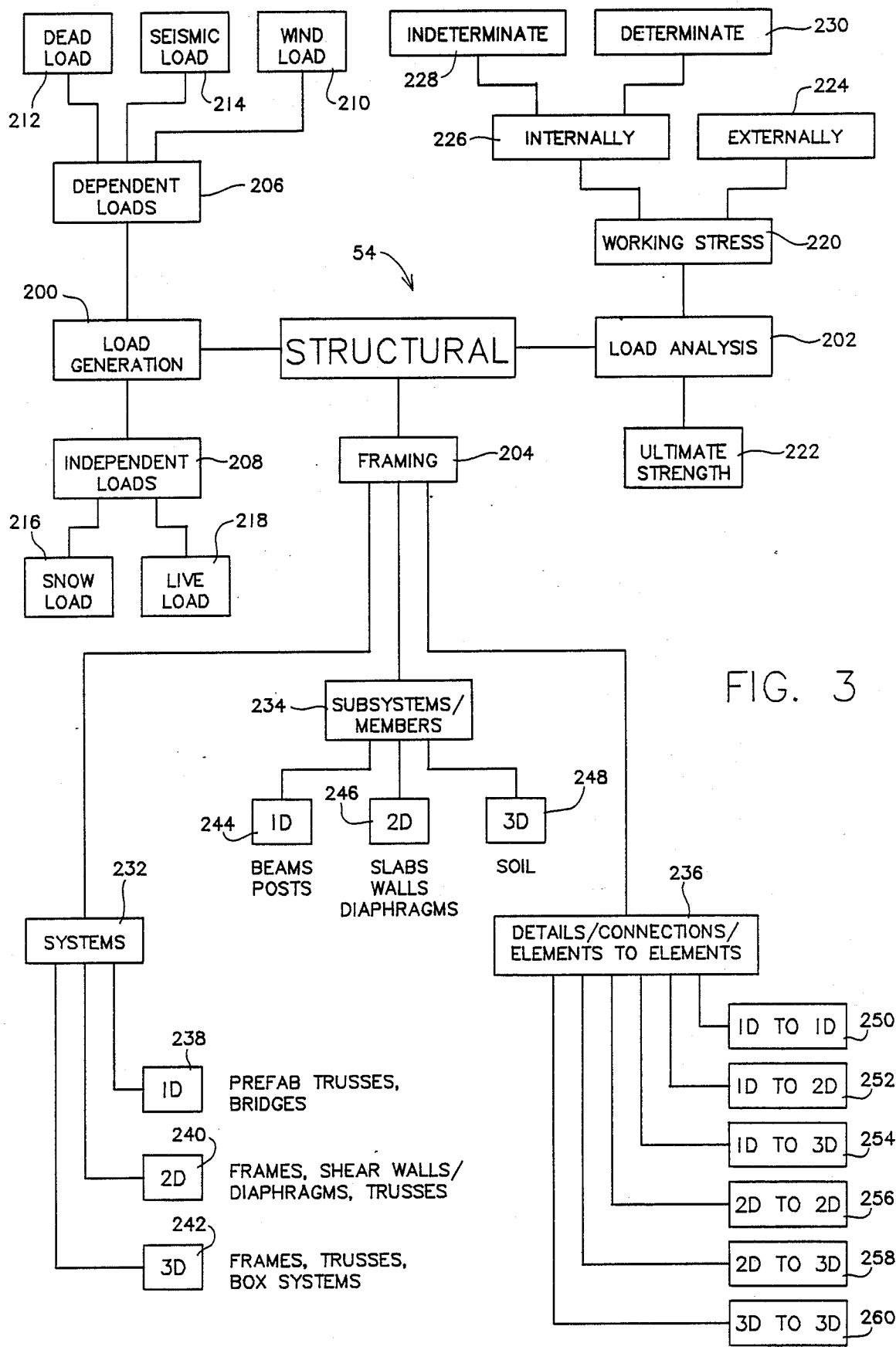
FIG. 3 is a more detailed block diagram of a portion of the block diagram shown in FIGS. 2A and 2B.

FIG. 3 shows chaining details of the structural module 54. The structural module 54 has load generation, load analysis, and framing routines 200, 202 and 204. The load generation routine 200 is in turn divided into dependent load and independent load subroutines 206 and 208. The dependent loads 206 include wind load 210, dead load 212 and seismic load 214. The independent loads 208 include snow load 216 and live load 218. The load analysis routine 202 has working stress and ultimate strength subdivisions 220 and 222. The working stress subroutine 220 includes external loads/reactions and stresses 224 and internal reactions and stresses 226 The internal stresses and reactions 226 are subdivided into indeterminate types 228 and determinant types 230. The framing routine 204 is divided into systems, members and connections subdivisions 232, 234 and 236. The systems subroutine 232 includes one dimensional types 238, such as prefabricated trusses and bridges, two dimensional types 240, such as frames, shear walls/diaphragms and trusses, and three dimensional types 242, such as space frames, space trusses and box systems. The members/subsystems subroutine 234 includes one dimensional types 244, such as beams and posts, two dimensional types 246, such as slabs, walls and diaphragms, and three dimensional types 248, such as soil. The connections subroutine 236 includes one dimensional to one dimensional connections 250, one dimensional to two dimensional connections 252, one dimensional to three dimensional connections 254, two dimensional to two dimensional connections 256, two dimensional to three dimensional connections 258, and three dimensional to three dimensional connections 260.

Figure 4B:
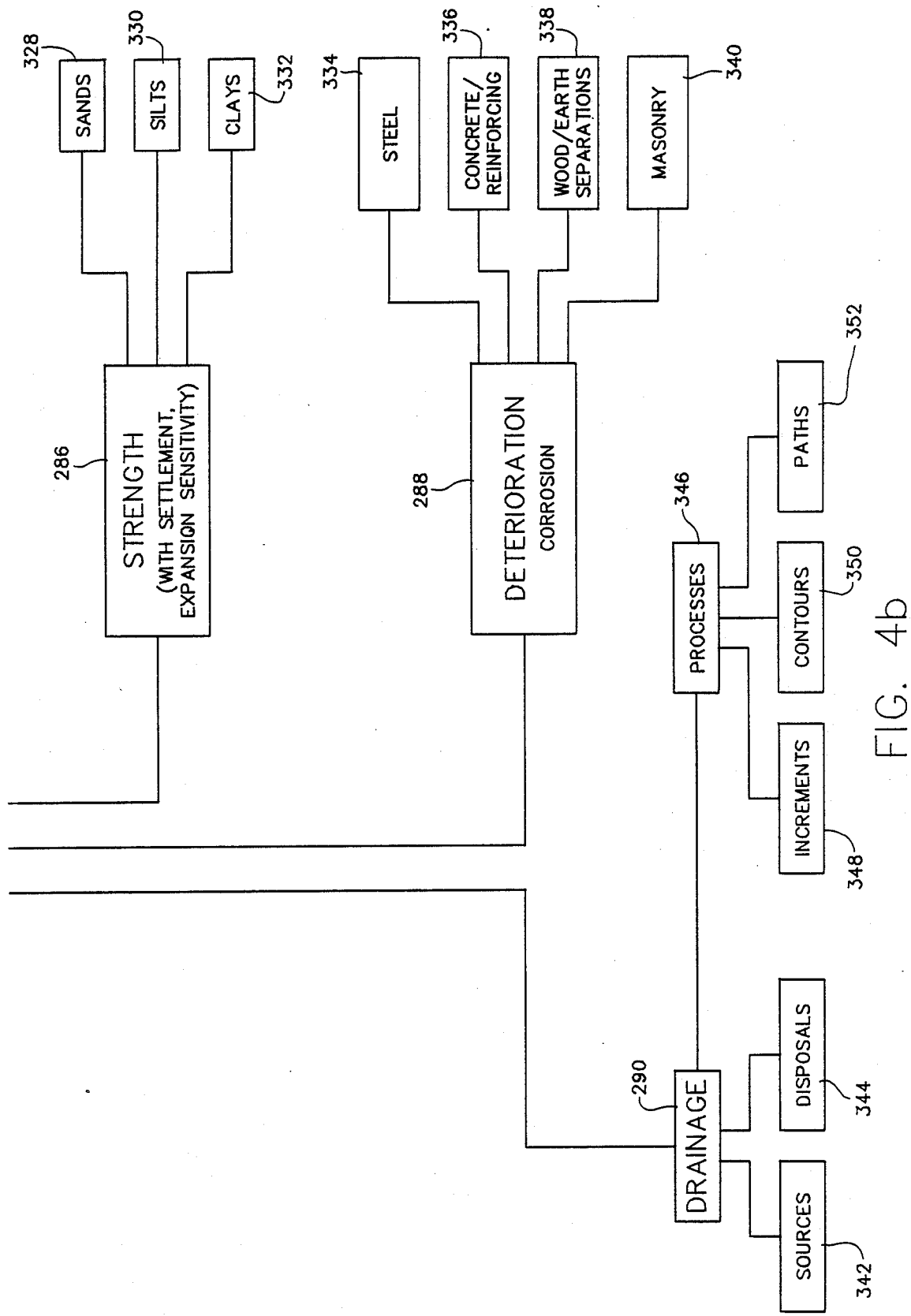

Details of the soils and geotechnical module 60 are shown in FIGS. 4A and 4B. The module 60 includes a foundation type routine 280, a sloped site details routine 282, a stability analysis routine 284, strength analysis routine 286, a deterioration and corrosion routine 288 and a drainage routine 290. The foundation routine 280 includes subroutines 292, 294, 296, 298, 300 and 302 for piers, piles, footings, mats, slabs and grade beams, respectively. The sloped site details routine 282 includes tie backs, erosion protection and driveway anchorage subroutines 304, 306, and 08, respectively. The stability analysis routine 284 includes liquefaction, creep, lateral spreading, regional subsidence, ground cracking, seismic/faulting, lurching and slope stability subroutines 310, 312, 314, 316, 318, 320, 322 and 324. The slope stability subroutine 324 includes retaining wall analysis at 326. The strength routine 286 includes subroutines for sands 328, silts 330 and clays 332. The deterioration routine 288 includes subroutines for steel 334, concrete/reinforcing 336, wood/earth separations 338 and masonry 340. The drainage routine 290 includes subroutines for sources 342, disposals 344 and processes 346. The processes subroutine 346 includes analysis for increments 348, contours 350 and paths 352.

Figure 5:
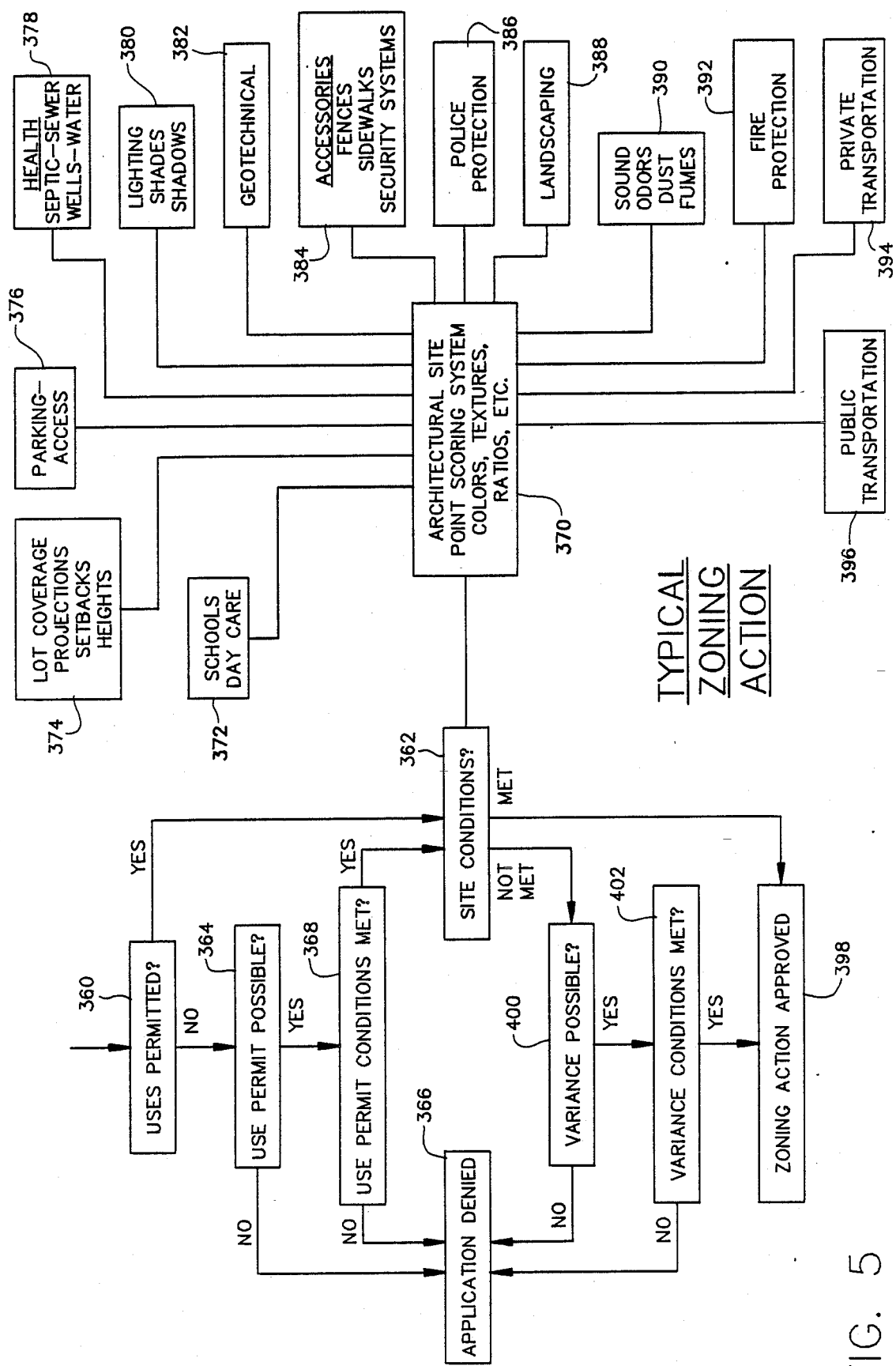
FIG. 5 is a combination block diagram and flow chart of a process in accordance with the invention.

FIG. 5 shows a typical zoning action. Decision block 360 determines whether uses proposed in a development plan are permitted. If yes, decision block 362 determines if site conditions have been met. If no, decision block 364 determines whether a non-conforming use permit is possible. If no, the development plan application is denied at 366. If yes, decision block 368 determines whether the non-conforming use permit conditions have been met. If no, the application is denied at 366. If yes, site conditions are evaluated at 362. To determine whether site conditions have been met, the system 10 of this invention uses an architectural site point scoring system, which evaluates colors, textures, ratios, and the like. The architectural site point scoring system routine 370 includes a school/day care subroutine 372, a lot coverage, projections, setbacks and heights subroutine 374, a parking-access subroutine 376, a health subroutine 378, which evaluates septic or sewer systems and wells or other water systems, a lighting subroutine 380, which evaluates shades and shadows, a geotechnical subroutine 382, and an accessories subroutine 384, which evaluates fences, sidewalks and security systems. Also included are a police protection subroutine 386, a landscaping subroutine 388, a sound, odors, dust and fumes subroutine 390, a fire protection subroutine 392, a private transportation subroutine 394 and a public transportation subroutine 396.

If the site conditions are met at 362, the zoning action is approved at 398. If the site conditions are not met at 362, decision block 400 determines whether a variance is possible. If no, the application is denied at 366. If yes, decision block 402 determines if variance conditions are met. If no, the application is denied at 366. If yes, the zoning action is approved at 398.

Figure 6:
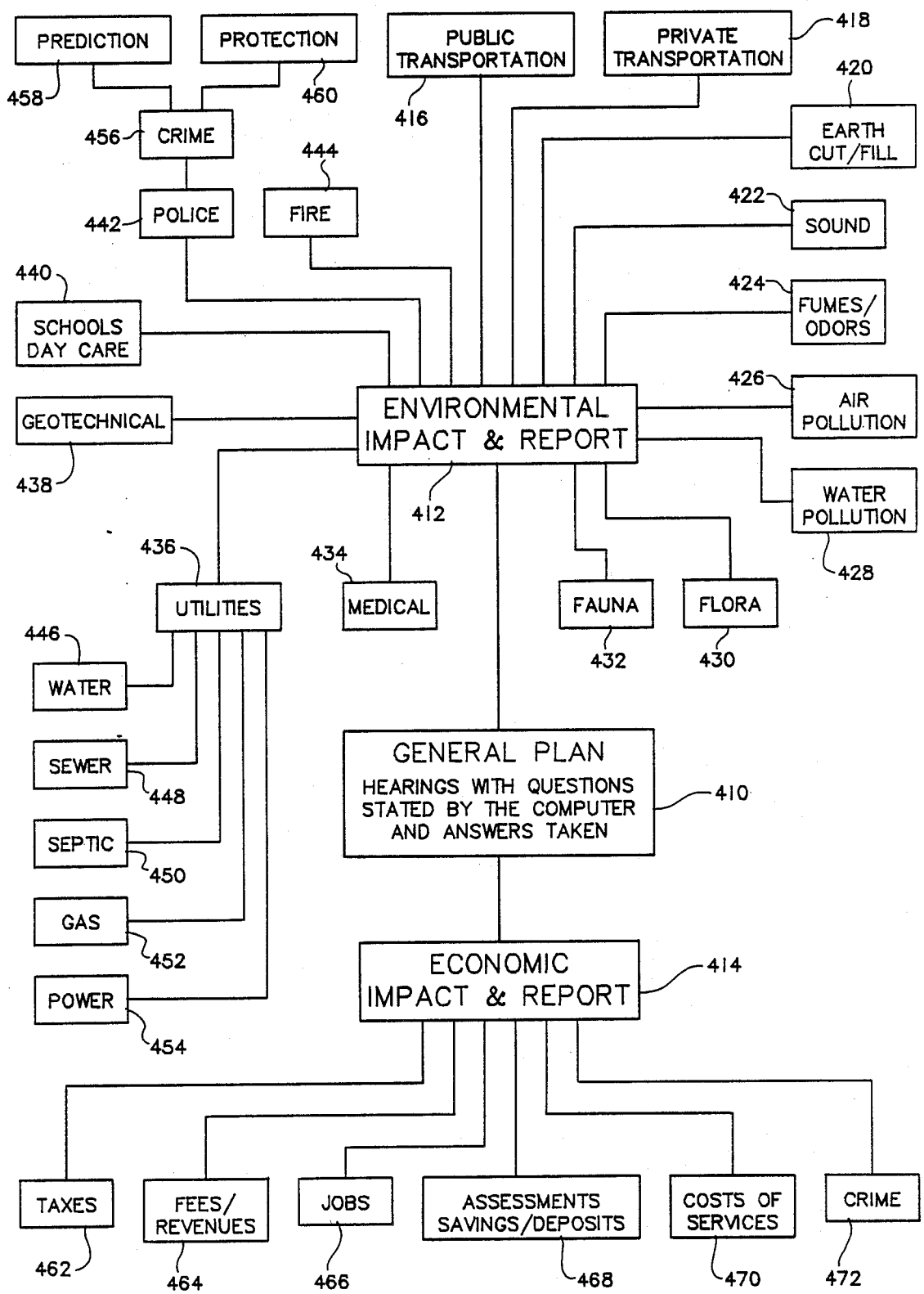
FIG. 6 is a block diagram showing components of another process in accordance with the invention.

FIG. 6 shows components of a typical action 410 under a local governing body's general plan. The system 10 utilizes the program of this invention to conduct the equivalent of a hearing with questions put by the system 10 to the applicant, neighbors, and other parties, and the answers given by the parties supplied as inputs to the data processing system 10. The general plan action 410 chains both an environmental impact study and report 412 and an economic impact study and report 414. The program used by the system 10 prepares the environmental impact study and report 412 through use of a public transportation routine 416, a private transportation routine 418, an earth cut/fill routine 420, a sound routine 422, a fumes and odors routine 424, an air pollution routine 426, a water pollution routine 428, a flora routine 430 and a fauna routine 432. Also included are a medical routine 434, a utilities routine 436, a geotechnical routine 438, a schools and day care routine 440, a police routine 442 and a fire routine 444. The utilities routine 436 includes water, sewer, septic, gas and power subroutines 446, 448, 450, 452 and 454. The police routine 442 analyzes the crime impact of the proposed development at 456 through use of a prediction subroutine 458 and a protection subroutine 460.

The economic impact study and report 414 are carried out using a taxes routine 462, a fees/revenues routine 464, a jobs routine 466, an assessments savings/deposits routine 468, a costs of services routine 470, and a crime routine 472. From all of these factors, compliance of the proposed development with the local plan is determined.

Figure 7:
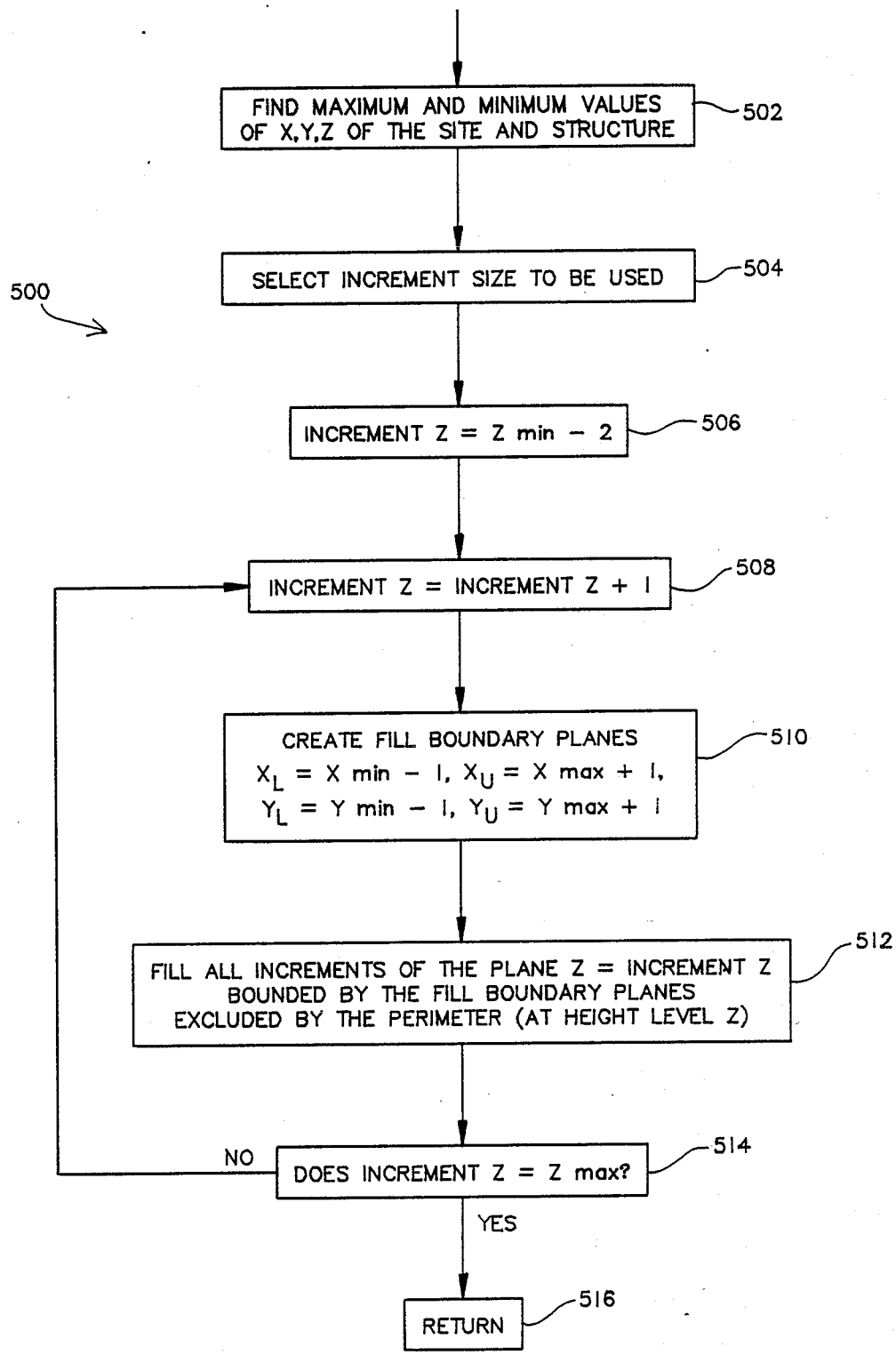
FIG. 7 is a flow chart for a routine forming part of a system and process in accordance with the invention.

FIG. 7 shows a routine 500 for carrying out a three dimensional fill method in the program of this invention. Block 502 finds maximum and minimum X, Y and Z values of a site and structure of the development plan being checked. Block 504 selects an increment size to be used in the routine 500. Block 506 establishes an initial Z axis value of $Z_{minimum} - 2$. Block 508 increments the Z axis value by one increment. Block 510 defines fill boundary planes for the current increment, i.e., establishes outer limits of spatial fill for the Z increment, by incrementing in the X and Y directions until a site or structure boundary is reached. Block 512 fills all increments of the plane Z=INCREMENT Z bounded by the fill boundary planes excluded by the perimeter at height level Z. Decision block 514 determines whether the INCREMENT Z equals $Z_{max}$. If not, the routine returns to block 508 for another increment and continues in a loop until INCREMENT Z equals $Z_{max}$. If so, the routine 500 returns at 516 to the point in the main program at which the routine 500 was called.

Figure 8:
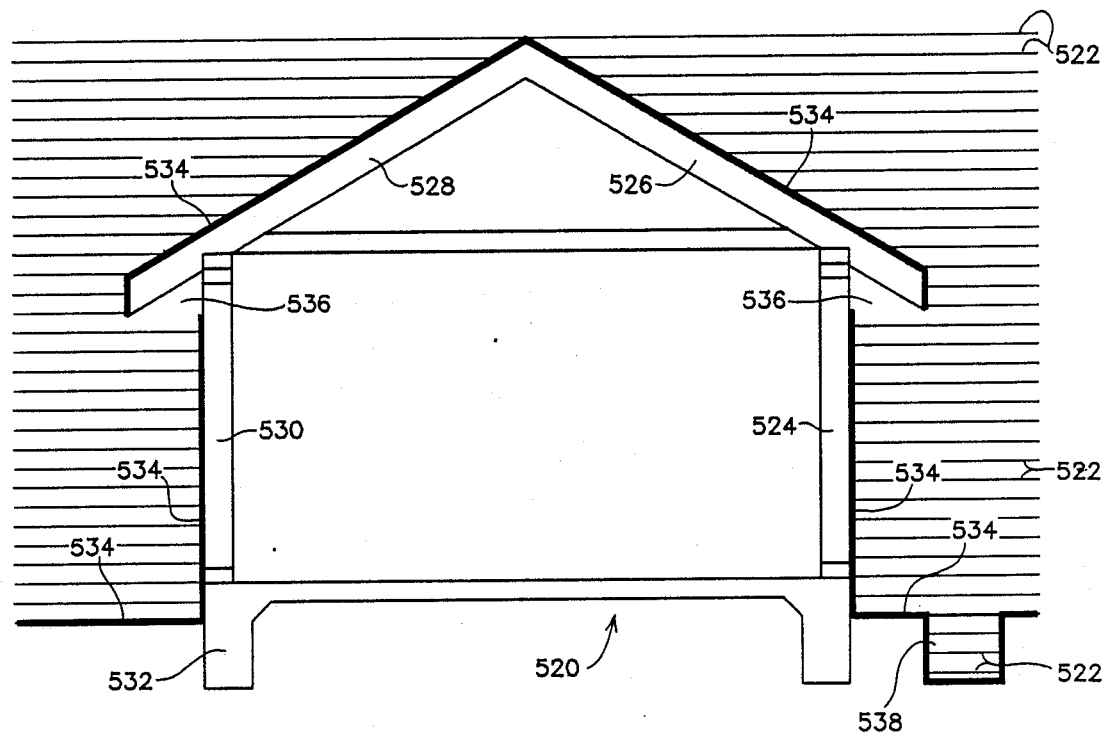
FIG. 8 is a schematic cross section of a building, together with additional information useful for a further understanding of the routine shown in FIG. 7.

FIG. 8 shows a building 520 in section, illustrating the fill method for wet and dry locations surrounding the building 520. The Z increment planes are represented at 522. The Z increments 522 constitute layers of fill around components 524, 526, 528, 530 and 532 comprising the building 520. Wet surfaces are shown at 534, which are exposed to moisture from rain and other weather. Location's 536 are dry because they are accessible only by a rise in Z coordinates of filling. Location 538 represents a water pocket because it is accessible only by a drop in Z coordinates. A drain is therefore required at this location.

Figure 9:
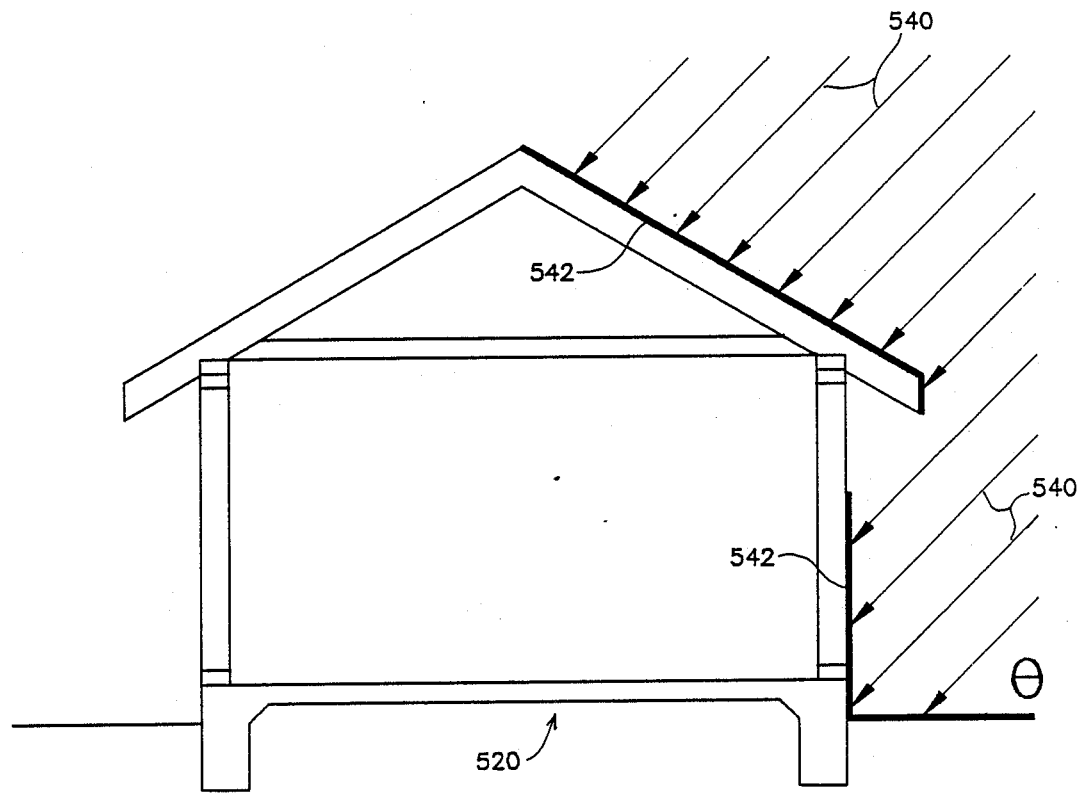
FIG. 9 is another schematic cross section of the building shown in FIG. 8, together with additional information useful for understanding another routine forming part of a system and process in accordance with the invention.

FIG. 9 shows the building 520 and a plurality of vectors 540 used in a vector fill routine of a program in accordance with the invention. The vectors 540 make an angle $\theta$ with respect to the horizontal. The angle of rotation $\theta$ is varied from 0 to $\pi$ radians during the vector fill routine. Wet boundaries 542 are defined by the surfaces of the building 520 which are reached by the vectors 540.

Figure 10:
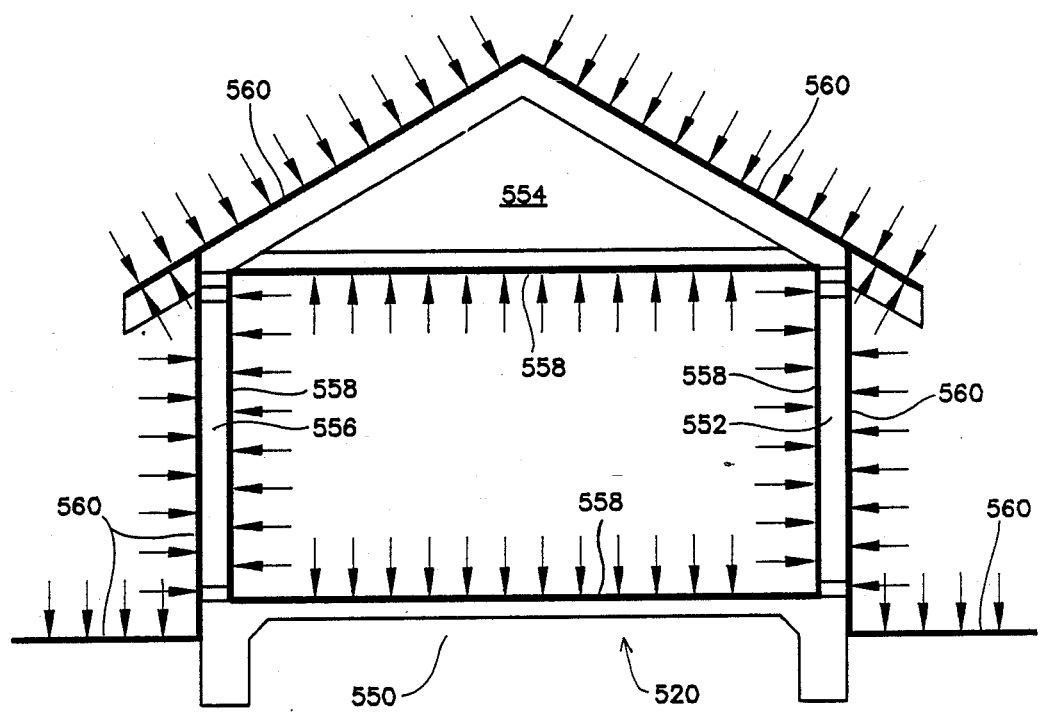
FIG. 10 is a third schematic cross section of the building shown in FIGS. 8 and 9, together with additional information useful for understanding a third routine forming part of a system and process in accordance with the invention.

FIG. 10 shows the building 520 and concealed spaces 550, 552, 554, 556 identified by a concealation routine forming part of a program in accordance with the invention. The concealed spaces 550, 552, 554 and 556 are defined by interior limits of filling 558 and external limits of filling 560. Such concealed spaces 550, 552, 554 and 556 are locations where electrical, plumbing, heating, ventilating and air conditioning equipment may be placed The concealation routine operates on the basis of the following predicate calculus algorithm:

$$\sim \text{World Filling} \wedge \sim (\Sigma \text{Enclosed Filling}) \rightarrow \text{Concealed Spaces}$$

Further details on the factors included in each routine and subroutine discussed above are available in the 1985 Edition of the Uniform Building Code, published by the International Conference of Building Officials, Whittier, Calif. 90601, the disclosure of which is incorporated by reference herein. Further details on the physical characteristics of building components stored at 24 in system 10 are available from the 1985 Edition of the Uniform Building Code Standards, also published by the International Conference of Building Officials, the disclosure of which is also incorporated by reference herein.

For example, Section 2516 (c) of the 1985 Uniform Building Code states in part:

"(c) Protection Against Decay and Termites. 1. Wood support embedded in ground. Wood embedded in the ground or in direct contact with the earth and used for the support of permanent structures shall be treated wood unless continuously below the groundwater line or continuously submerged in fresh water. Round or rectangular posts, poles and sawn timber columns supporting permanent structures which are embedded in concrete or masonry in direct contact with earth or embedded in concrete or masonry exposed to the weather shall be treated wood. Treatment shall conform to U.B.C. Standard No. 25-12, Tables Nos. 25-12-B through 25-12-F, for ground contact."

Suitable programs that can be easily modified for disclosed in the following publications and accompanying programs Korites, B. J., Engineering Software for Microcomputers, 1982; Korites, C. E. and B. J., CAD-BASIC, 1985; Korites, B. J., Beam Sections; Korites, B. J. and Novate, M., S/SAM, 1984, all obtainable from Kern International, Duxbury, Mass. 02331, the disclosures of which are incorporated by reference herein.

For example, Korites, Engineering Software for Microcomputers, pp. 2-31-2-33 states in part:

CAD 30
PROGRAM LISTING

... The structure of this program is important. Note that the program uses a menu-command-operation-return to menu sequence. When a particular command is specified, control drops to whatever subroutine is responsible for carrying out that particular operation.

This structure makes the program easy to follow and fix. It also allows us to add new operations with little difficulty. For example, suppose we want to add physical properties to the lines in a drawing. We may, for example, want the lines to represent connectors in an electric circuit, in which case we would want to attach electrical properties to the lines. Or they may represent beams in a structure, in which case we might want to give them weights and dimensions. This could be done neatly by adding an option to the menu which we might call "Property ". If the user types "PR", control would drop to a subroutine where the user would key in the member number (I) and the physical properties. We could even assign physical properties to the nodes in the same manner."

The same publication, pp. 2-48-2-49 states:

"PROGRAM CAD 50

As mentioned in the discussion of CAD30, it is a relatively simple matter to add physical properties to either the points or lines in a drawing. In this program we add properties to lines. The procedure is to first create the geometry of a drawing using either CAD20 or CAD30, then run CAD50 and add the properties. CAD50 operates much like CAD30 in that it can recall drawings from disk and update them. In fact, it is almost identical to CAD30 except that we have removed the section that updates points and lines and added a section that adds physical properties to existing lines.

You may ask why this operation couldn't have been included in CAD30? The reason is that the memory of the Apple II is not large enough to hold such a large program along with a reasonable amount of point and line data. When we try to add the physical property routine to CAD30, it infringes upon the portion of memory that holds the page 1 hi-res graphics information. As a result, part of the screen image is destroyed. This is a good example of the philosophy referred to earlier in this chapter—the limited active memories of microcomputers require that complex operations be carried out in small steps by separate programs with the intermediate data being stored on disk.

It should be mentioned, that the programs in this book have not been optimized for minimum memory requirements. This is because we have deliberately coded them in an open style to enhance readability. With a little effort, you should be able to reduce them in size considerably and combine many of the operations into one large program.

PROGRAM LISTING

Referring to the program listing, an "ADD PROPERTIES" command has been added to the menu in line 112. Line 148 shifts control to subroutine 8100. This subroutine has been specialized to assign material properties to the lines of the drawing. It could be modified to assign any type of properties, or could even be made general. It presents a menu of materials: aluminum, titanium, steel and magnesium. The material code is entered in line 8115. The number of the drawing line which is to be assigned this material is input in line 8120. Control then drops to subroutine 8200 where the variable DE(I) is set equal to the material density (lbs/in$^2$). The user has to type in only the material code —AL, ST, TI or MA—the program searches for the associated material properties.

We could have added as many properties as we wanted in addition to the density. For example, we could have set up arrays for Young's Modulus, thermal conductivity, Poisson's ratio, etc. This procedure eliminates the chore of typing in these properties every time we wish to define a line. All we have to do is specify the material and the software finds the associated physical properties and attaches them to the line. A subroutine like 8200 is called a "library" or "catalog" since it contains specifications corresponding to many different type of materials or parts. Note that the routine which prints the drawing file has been modified to print the material properties.

We can CAD50 more than once on the same drawing. For example, when we used CAD20 we developed a drawing called CAD20.TRUSS. We can recall that drawing with CAD50, add material properties, and replace it on disk under the same name, or a different one such as CAD50, TRUSS but the file will contain material properties for the lines. We could recall CAD=.TRUSS later and change the material properties if we wish."

Background on the artificial and synthetic intelligence-program languages used for the program of this invention is available from the Prolog-86 TM User's Guide and Reference Manual and accompanying software, Version 1.12, obtainable from MICRO-AI, Rheem Valley, Calif. 94570, the disclosure of which is incorporated by reference herein, and TLC—LISP Documentation: Primer, Metaphysics and Reference Manual and accompanying software, 1984, obtainable from The LISP Company, Redwood Estates, Calif. 95044, the disclosure of which is also incorporated by reference herein.

For example, the Prolog-86 User's Guide, pp. 60-62, states:

15.1 If-Then Production Rules

There are many expert systems that solve problems by using a set, of simple rules. Each of these rules is called an 'if-then' rule, a 'situation-action' rule, or a 'production' rule. The purpose of this section is to give an example of how production rules can be implemented in PROLOG-86 to produce a simple expert system.

Experience has shown that rules of the following form can be used by a computer solve various problems which, if done by a human, would be thought of as exhibiting a certain degree of intelligence. The basic form of the rules is:

```
IF  (fact 1 is true)      AND
    (fact 2 is true)      AND
    (fact n is true)
THEN (conclusion 1 is true).
```

For example, the following can be thought of an production rules

```
IF  (a tree is green in winter)
THEN (it is a conifer).
IF  (an animal is a mammal)       AND
    (the animal swims)            AND
    (the animal is gray)          AND
    (the animal is huge)
THEN (the animal is a whale).
IF  (the infection is a pelvic-abscess)   AND
    (there are rules that mention in their
     premise Enterobacteriaceae)          AND
    (there are rules that mention in their
     premise gram positive rods)
THEN (there is suggestive evidence (.4) that
      the rules dealing with Enterobacteriaceae
      should be evoked before those dealing with
      gram positive rods).
```

Systems based on the above type of rules have produced convincing results in such diverse fields as medical diagnosis (MYCIN), chemical analysis (DENDRAL) and mineral exploration (PROSPECTOR)

In the simple expert system discussed in this section we will consider rules which will allow the computer to determine what type of an animal you are form;

```
IF  (fact 1 is true)      AND
    (fact 2 is true)      AND
    (fact n is true)
THEN (conclusion is true).
``` can be expressed by a clause of the form:
conclusion:- fact1, fact2, ... , factn.
Thus, to express the rule:

```
IF  (an animal has hair)
THEN (it is a mammal).
``` you use the PROLOG-86 rule:

```
isa (Animal,mammal) : -
    has (Animal,hair),           % Rule 1
    asserta (isa (Animal,mammal)).
```

Here the goal is a(Animal,mammal) means that Animal is a mammal. Similarly, has (Animal,hair) means that Animal has hair. Thus, the above PROLOG-86 rule states that Animal is a mammal if it has hair. If the Animal has hair, then the fact that the Animal is a mammal is added to the database. Similarly, you can express the more complex rule:

```
IF  (an animal is a mammal)       AND
    (the animal is a carnivore)   AND
    (the animal has black stripes)
THEN (the animal is a tiger).
``` by the PROLOG-86 clause

```
isa (Animal,tiger) : -
    isa (Animal, mammal),
    isa (Animal, carnivore),
    has (Animal, 'black stripes'),   % Rule2
    asserta (isa(Animal, tiger)).
```

Finally, you can add facts about a given situation to your database For example, if you know that animal1 has hair, is a carnivore and has black stripes, then you add the following clauses to your database:

```
has (animal 1, hair).              % Fact 1
has (animal 1, hair).              % Fact 1
isa (animal 1, carnivore).         % Fact 2
has (animal 1, 'black stripes').   % Fact 3
```

If you then ask:
is a(animal1,mammal)?
PROLOG-86 uses Rule 1 and Fact 1 to answer:
**yes
Similarly, if you want to know what animal1 is you type:
is a(animal1, X)?
PROGLOG-86 uses Rule 2, Rule 1, and Facts 1-3 to answer:
X=tiger As you can see, PROLOG-86 is a convenient language in which to implement a production system".

TLC—Lisp Documentation, Introduction, pp. 6-8, states:

"In LISP, data items have an associated type, while variables are type-free, meaning a variable may have values of any type, associated with it in a totally dynamic way. This means, for example, that a variable may have an integer value associated with it at one moment, and later in the same program that variable might be used to name a list value or even a function value.

One of the most distinctive features of LISP is its representation of programs as data items. For example, if we had values 3 and 2 associated with X and Y, respectively, we could evaluate the list (ADD X (MUL 6 Y)) receiving the value 15. This duality of program and data is more than an historical anomaly; it is more than an expediency based on the lack of available character sets to support an Algol-like syntax for LISP. It is an important ingredient in any application that expects to manipulate existing programs or construct new programs. Such applications include editors, debuggers, program transformation systems, as well as symbolic mathematics systems and Artificial Intelligence applications (a system that learns must be expected to change its behavior).

> We'll not get into a discussion of the merits or feasibility of AI; rather, we stay in the (slightly) less emotionally charged area of interactive systems design. The critical ingredient here is low to handle debugging and modification of a program "on-the-fly". That is, we cannot afford to stop the program, rebuild parts of it and restart the computation. The system may be running a real-time or life-threatening system, or it may be that the intermediate computation has taken a substantial time to develop and the changes that are desired will invalidate only a small segment of that computation. The point here is to envision a situation where the traditional edit, re-compile, link and load model will not suffice. In such a case we have to modify existing programs and data. In such a situation we need to have access to a form of the program that we can manipulate not as instructions, but as data. Those who have had experience with traditional machine-level debugging will recognize this type of situation. LISP is one of the few other "machines" that will support such "one-the-fly" modification.
>
> We can build what are called 'structure editors' that will let us examine and modify the list-structure representation of the programs. We can build LISP debuggers that can interact with such structure editors to do the necessary detective work to isolate problems. This latter situation involves more than just having programs available as data, it involves having the dynamic state modification. Such situations border on the introspective.
>
> There are other, less dramatic, situations where an "intelligent" form of programa is useful. Even in the more traditional situation of editing a textual form (rather than structural form) of program, we should be able to recover the source form. Compare this with the typical compiler-based situation wherein there is a wide gap between the running code and the user's source; this situation is exacerbated by optimizing compliers that widen that chasm beyond recovery.
>
> In contrast, even those LISP's that do not deal directly with the structure will allow recovery of the source from the running code. The simplest tactic is to print the list representation into an edit buffer, edit that text, and then pass the new text through the LISP reader. A more substantial task involves the partial compilation of the source into an intermediate code, which is "reversible" in the sense that it can be de-compiled into the user's code. These latter two solutions are partial implementations of the more comprehensive solution of making the program and the dynamic state of the computation (called the control structure) directly available as data objects in the language.

Program transformation systems are another example of treating program as data. Such systems span the spectrum from traditional compilers to source-to-source program improving systems. In its general form, a compiler expects a program as input and produces a program for another machine as output. Again, if the language supports programs as data objects, this compiler can be expressed in the language. Most other languages obscure the problem by describing the compiler as a program which takes a string as input, converts the string to an internal non-executable form, and produces another string as output. This is a very localized view of the world of computing. A healthier approach views compilation as the last phase of the program construction process where the compiler is to transform a correct program into one that will execute more rapidly. Earlier phases of the programming process are responsible for the construction, debugging, and modification of the program. The unifying perspective of a program as a data structure cleanses the intellectual palate.

> We will also see another program transformation technique in a few sections hence: LISPmacros. Macros in LISP function similarly to macros in assembly language, allowing us to abbreviate sequences of code that the language processor can expand for us automatically. In assembly language the macros are expanded when the source code is transformed into machine code. LISP tends to operate in a slightly different manner, expanding the macro to new LISP code dynamically, and then executing that code. In compiler-based LISPs the analogy to assembly language is exact: the code gets expanded once, and compiled; even without a compiler, we can indicate that we want the macros "displaced", meaning that they expand once and the expanded code actually replaces the application of the macro.
>
> In summary, LISP is best thought of as a "high level assembly language for complex programming". It contains a library of operations, including the system-level components like symbol tables, scanners, parsers, and unparsers, with a processing unit to evaluate the combinations of these ingredients. Yet it imposes little structure on the programming process, believing that discipline is best left to the intelligence of the programmer. LISP is a tool, no better or worse than its user. One goal of this documentation is to develop and reinforce an appreciation for self-discipline as well as reveal the elegance and beauty of LISP."

TLC—Lisp Documentation, Part II, Examples, p. 5, states:

> "When learning a new language, it is always useful to examine a reasonably large program written in that language. This is particularly useful when learning a language whose power and scope is as broad as that of LISP.
>
> One complaint about LISP is its syntax; while other languages expend a great deal of effort on complex notation, LISP uses simple variations on the single theme—(<operator> <operand-1>. . . <operand-n>). The simplified notation has several benefits, as we have seen. A benefit that we wish to exploit in this section is the simplicity of the parser; the parser is the algorithm to translate the external list notation into the internal tree representation. In a moment we will write a LISP parser in about a half-dozen lines of LISP. Through a series of simple transformations, we will use the power of LISP and its notational simplicity to write a parser that will camouflage the LISP syntax under an Algol-like notational blanket. The final parser will be user-modifiable and table-driven; it will exploit LISP's property lists to maintain the tables. Those tables will contain both data and parsing programs, exploiting the program/data duality to give us a flexible, compact and understandable parser. It is ironic: to quiet the complaints of the non-LISP community who believe LISP's syntax and the above-mentioned community who believe LISP's syntax and the above-mentioned programming features are obscure and difficult, we depend on those very attributes to develop a flexible and highly readable parser for those people. It would be a non-trivial exercise to encode this parsing scheme in another language without sacrificing flexibility or clarity.

By the time we have constructed the last Algol-like parser you may feel that the power of the undecorated LISP is sufficiently seductive that the notational "convenience" which we constructed will go unused.

The example of this section requires some concentration; the problem is non-trivial and LISP may be new to you. However, the major difficulty is unlearning old programming habits and restriction, and learning how to use the power of LISP to describe complex problems which could not be succinctly described and designed with other tools."

TLC—Lisp Documentation, Part III, Reference Manual, p. 80, states:

"Since LISP programming tends to occur in a dynamic, exploratory setting, it is important to be able to experiment with programming techniques and modify parts and pieces without resorting to the archaic paradigm of edit-compile-run-debug-edit . . . and iterate. That is, we need have the freedom to modify decisions 'on the fly'. In the next section (*Errors and Debugging*) we'll illustrate the TLC primitives that will let us build forgiving debuggers-the kind that will let us modify programs that are under execution, let us supply values for undefined functions and then continue, or let us gracefully retreat from a computation that we no longer wish to pursue.

In this section we wish to demonstrate similar kinds of tools for the (somewhat less) dynamic task of class construction and exploration. As with interactive debugging, such tools expect that their user be cognizant of the power they possess."

It should now be readily apparent to those skilled in the art that a novel plan review system and process capable of achieving the stated objects of the invention has been provided. This invention materially simplifies and improves the plan checking process by utilizing computer technology to determine compliances with local ordinances and regulations, such as building codes. By using compatible software both for generating development plan documents and checking compliance of the development plan with local ordinances and regulations, delays in checking compliance are avoided. The software incorporates improved techniques for determining structural boundaries, for representing building elements in a machine intelligible format, and for safeguarding against spurious information.

It should further be apparent to those skilled in the art that various changes in form and details of the invention as shown and described may be made. It is intended that such changes be included within the spirit and scope of the claims appended hereto.

What is claimed is:

1. A process for checking a development plan configuration against predetermined development plan configuration standards, which comprises: providing the development plan configuration to be checked as an input to a data processing system as data in a form representing at least one physical characteristic of building components in the development plan and intelligible to the data processing system; storing the development plan data in a path through a tree structure; storing the development plan configuration standards against which the development plan configuration is to be checked in the data processing system as data in a form representing at least one physical characteristic of building components in the development plan configuration standards and intelligible to the data processing system; providing a control program for evaluating the at least one physical characteristic of the building components in the development plan configuration data according to the at least one physical characteristic of the building components in the development plan standards configuration data to the data processing system; evaluating the at least one physical characteristic of the building components in the development plan configuration data according to the at least one physical characteristic of the building components in the development plan standards configuration data to determine compliance of the development plan configuration with the development plan configuration standards using the control program in the data processing system; and providing development plan configuration standards compliance results of the evaluation as an output from the data processing system.

2. The plan checking process of claim 1 in which the development plan configuration is evaluated in the form of multiple dimensional equations in multiple coordinate systems representing building components located with respect to reference points.

3. The plan checking process of claim 1 in which the development plan configuration identifies the building components by a code and said process further comprises storing physical characteristics of the building components indexed by the code in the data processing system.

4. The plan check process of claim 1 in which an explanation facility for the results of the evaluation is provided.

5. A process for checking a development plan configuration against predetermined development plan configuration standards, which comprises: providing the development plan configuration to be checked as an input to a data processing system as data in a form representing at least one physical characteristic of building components in the development plan and intelligible to the data processing system; storing the development plan configuration standards against which the development plan configuration is to be checked in the data processing system as data in a form representing at least one physical characteristics of building components in the development plan configuration standards and intelligible to the data processing system; providing a control program for evaluating the at least one physical characteristic of the building components in the development plan configuration data according to the at least one physical characteristic of the building components in the development plan standards configuration data to the data processing system; evaluating the at least one physical characteristic of the building components in the development plan configuration data according to the at least one physical characteristic of the building components in the development plan standards configuration data to determine compliance of the development plan configuration with the development plan configuration standards using the control program in the data processing system by evaluating the development plan configuration in the form of multiple dimensional equations in multiple coordinate systems representing building components located with respect to reference points; determining site or structure boundaries in the development plan configuration with the data processing system by finding maximum and minimum values of the site or structure in three dimensions, selecting an increment size along one of the three dimensions, and filling a volume in the three dimensions by moving along one of the three dimensions in the selected increments and providing development plan configuration standards compliance results of the evaluation as an output from the data processing system.

6. The plan checking process of claim 5 in which the volume is filled by incrementing inward from an outer boundary until another boundary is reached.

7. The plan checking process of claim 5 in which the volume is filled by incrementing outward from a point of origin until an outer boundary is reached.

8. The plan checking process of claim 5 in which the volume is filled by defining parallel planes at locations along one dimension in the increments, moving in the increments along the parallel planes in two dimensions until a boundary is reached, and filling an area defined by the boundary in each of the two dimensions.

9. The plan checking process of claim 8 in which dry locations in the development plan configuration are defined as those locations accessible by an upward movement in coordinates extending along a direction of changing height.

10. The plan checking process of claim 8 in which locations requiring a drain are defined as those locations accessible only by a drop in coordinates extending along a direction of changing height.

11. The plan checking process of claim 5 in which concealed spaces in a structure of the development plan configuration are defined from interior and exterior limits of filling of the volume filling.

12. A process for checking a development plan configuration against predetermined development plan configuration standards, which comprises: providing the development plan configuration to be checked as an input to a data processing system as data in a form representing at least one physical characteristic of building components in the development plan and intelligible to the data processing system; storing the development plan configuration standards against which the development plan configuration is to be checked in the data processing system as data in a form representing at least one physical characteristic of buidling components in the development plan configuration standards and intelligible to the data processing system; providing a control program for evaluating the at least one physical characteristic of the building components in the development plan configuration data according to the at least one physical characteristic of the building components in the development plan standards configuration data to the data processing system; evaluating the at least one physical characteristic of the building components in the development plan configuration data according to the at least one physical characteristic of the building components in the development plan standards configuration data to determine compliance of the development plan configuration with the development plan configuration standards using the control program in the data processing system by evaluating the development plan configuration in the form of multiple dimensional equations in multiple coordinate systems representing building components located with respect to reference points; determining boundaries in the development plan configuration by generating a plurality of vectors and varying angle of the plurality of vectors with respect to the horizontal and determining where the vectors intersect surfaces of the plan and providing development plan configuration standards compliance results of the evaluation as an output from the data processing system.

13. The plan checking process of claim 12 in which wet boundaries of a structure in the development plan configuration are defined as exposed aurfaces of the structure which are reached by the vectors when inclined with respect to horizontal.

14. A process for checking a development plan configuration against predetermined development plan configuration standards, which comprises: providing the development plan configuration to be checked as an input to a data processing system as data in a form representing at least one physical characteristic of building components in the development plan and intelligible to the data processing system; storing the development plan configuration standards against which the development plan configuration is to be checked in the data processing system as data in a form representing at least one physical characteristic of building components in the development plan configuration standards and intelligible to the data processing system; providing a control program for evaluating the at least one physical characteristic of the building components in the development plan configuration data according to the at least one physical characteristic of the building components in the development plan standards configuration data to the data processing system; evaluating the at least one physical characteristic of the building components in the development plan configuration data according to the at least one physical characteristic of the building components in the development plan standards configuration data to determine compliance of the development plan configuration with the development plan configuration standards using the control program in the data processing system; tracing usage of subroutines in determining compliance of the development plan configuration with the standards, comparing the traced subroutine usage against a specification of subroutine usage to determine if data entered with the development plan configuration is valid and providing development plan configuration standards compliance results of the evaluation as an output from the data processing system.

15. The plan checking process of claim 14 in which order and number of times subroutines are used, time in computations, bytes used, and subroutines not used are traced, and these uses are compared against the specification of subroutine usage.

16. The plan checking process of claim 15 in which predicates used, arguments used, rules used, objects used, data used, values used, pointers used and source/-termination of the pointers are traced, and such uses are compared against the specification of subroutine usage to determine if the data entered with the development plan configuration is valid.

17. A process for checking a development plan configuration against predetermined development plan configuration standards, which comprises: providing the development plan configuration to be checked as an input to a data processing system as data in a form representing at least one physical characteristic of building components in the development plan and intelligible to the data processing system; providing the development plan configuration standards against which the development plan configuration is checked in the form of artificial intelligence structures, including rules, frames and nets; storing the development plan configuration standarde against which the development plan configuration is to be checked in the data processing system as data in a form representing at least one physical characteristic of building components in the development plan configuration standards and intelligible to the data processing system; providing a control program for evaluating the at least one physical characteristic of the building components in the development plan configuration data according to the at least one physical characteristic of the building components in the development plan standards configuration data to the data processing systems; evaluating the at least one physical characteristic of the building components in the development plan configuration data according to the at least one physical characteristic of the building components in the development plan standards configuration data to determine compliance of the development plan configuration with the development plan configuration standards using the control program in the data processing system; and providing development plan configuration standards compliance results of the evaluation as an output from the data processing system.

* * * * *